United States Patent
Yamamoto et al.

(10) Patent No.: US 6,709,880 B2
(45) Date of Patent: Mar. 23, 2004

(54) SEMICONDUCTOR DEVICE AND A MANUFACTURING METHOD OF THE SAME

(75) Inventors: Jiro Yamamoto, Tachikawa (JP); Fumio Murai, Hinode (JP); Tsuneo Terasawa, Ome (JP); Tosiyuki Yamamoto, Tachikawa (JP)

(73) Assignees: Hitachi, Ltd., Tokyo (JP); Hitachi ULSI Systems, Co., Ltd., Tokyo (JP)

( * ) Notice: Subject to any disclaimer, the term of this patent is extended or adjusted under 35 U.S.C. 154(b) by 39 days.

(21) Appl. No.: 10/171,769

(22) Filed: Jun. 17, 2002

(65) Prior Publication Data

US 2003/0054580 A1 Mar. 20, 2003

(30) Foreign Application Priority Data

Sep. 18, 2001 (JP) .................. 2001-282546

(51) Int. Cl.$^7$ .............................. H01L 21/00
(52) U.S. Cl. ...................................... 438/22
(58) Field of Search ............................ 438/22

(56) References Cited

U.S. PATENT DOCUMENTS

| | | | | |
|---|---|---|---|---|
| 5,728,492 A | * | 3/1998 | Kawata | 430/5 |
| 5,763,894 A | * | 6/1998 | Enichen | 250/492.2 |
| 6,069,363 A | * | 5/2000 | Golloday | 250/396 |
| 6,320,187 B1 | * | 11/2001 | Enichen | 250/252.1 |
| 6,541,783 B1 | * | 4/2003 | Robinson | 250/492.23 |

OTHER PUBLICATIONS

K. Suzuki et al., "Nikon EB Stepper: Its System Concept and Countermeasures for Critical Issues", *Emerging Lithographic Technologies IV*, Proceedings of SPIE, vol. 3997, 2000, pp. 214–224.

T. Yamaguchi, "EB Stepper–A High Throughput Electron–Beam Projection Lithography System", *Japan Journal of Applied Science*, vol. 39, Part 1, No. 12B, Dec. 2000, pp. 6897–6901.

* cited by examiner

*Primary Examiner*—David Nelms
*Assistant Examiner*—Thao Phuong Le
(74) *Attorney, Agent, or Firm*—Miles & Stockbridge P.C.

(57) ABSTRACT

There is disclosed a method for forming micro patterns in a semiconductor integrated circuit device with high productivity and high accuracy. A photolithography having high throughput and electron beam lithography using a reticle and having relatively high throughput and high resolution are selectively used so as to obtain highest throughput while satisfying accuracy and resolution required for each product/layer. In the case of using the electron beam lithography, a non-complementary reticle and a complementary reticle are selectively used so as to obtain highest throughput while satisfying required accuracy and resolution. Thus, productivity and integration can be improved for the semiconductor integrated circuit device.

30 Claims, 40 Drawing Sheets

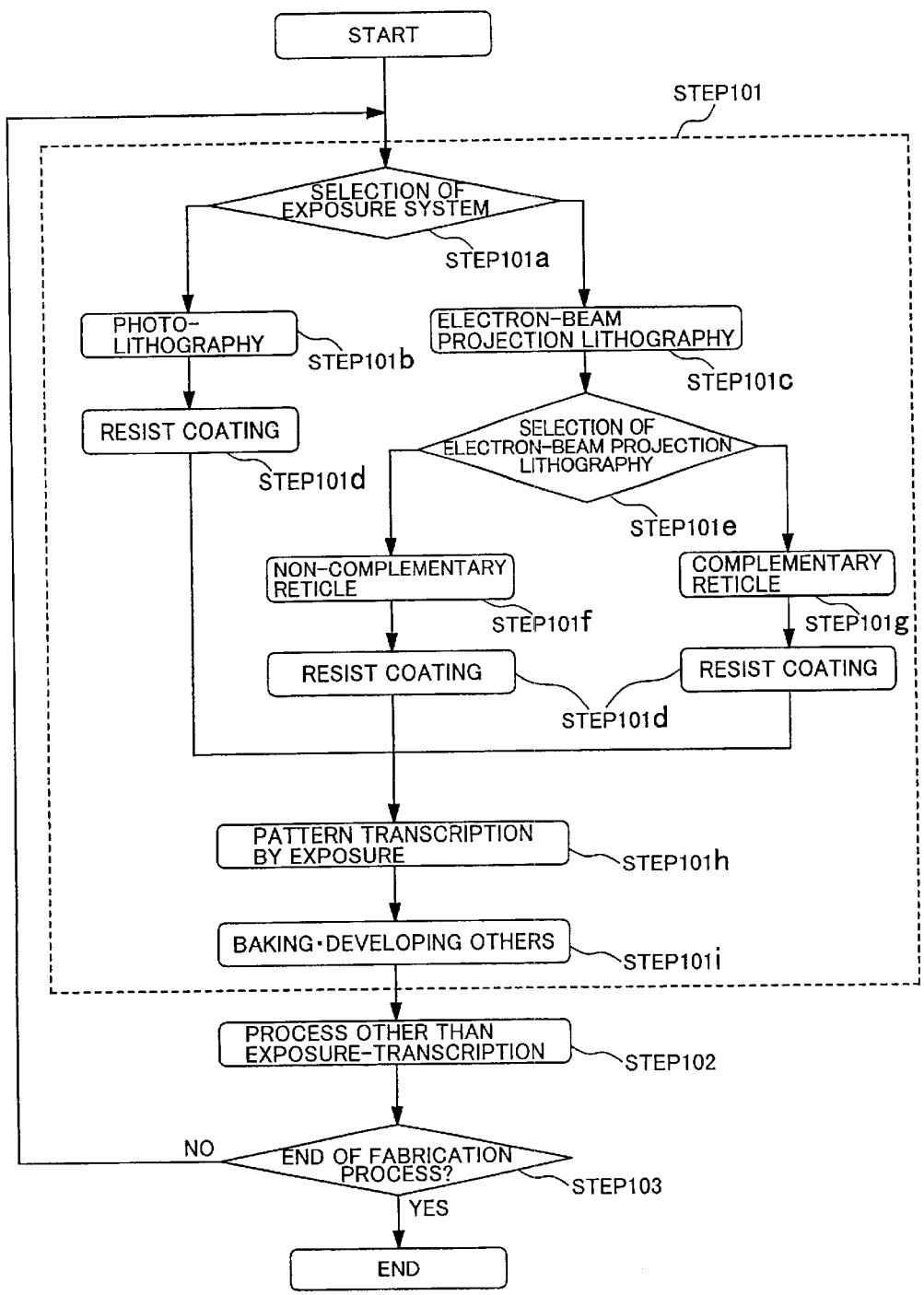

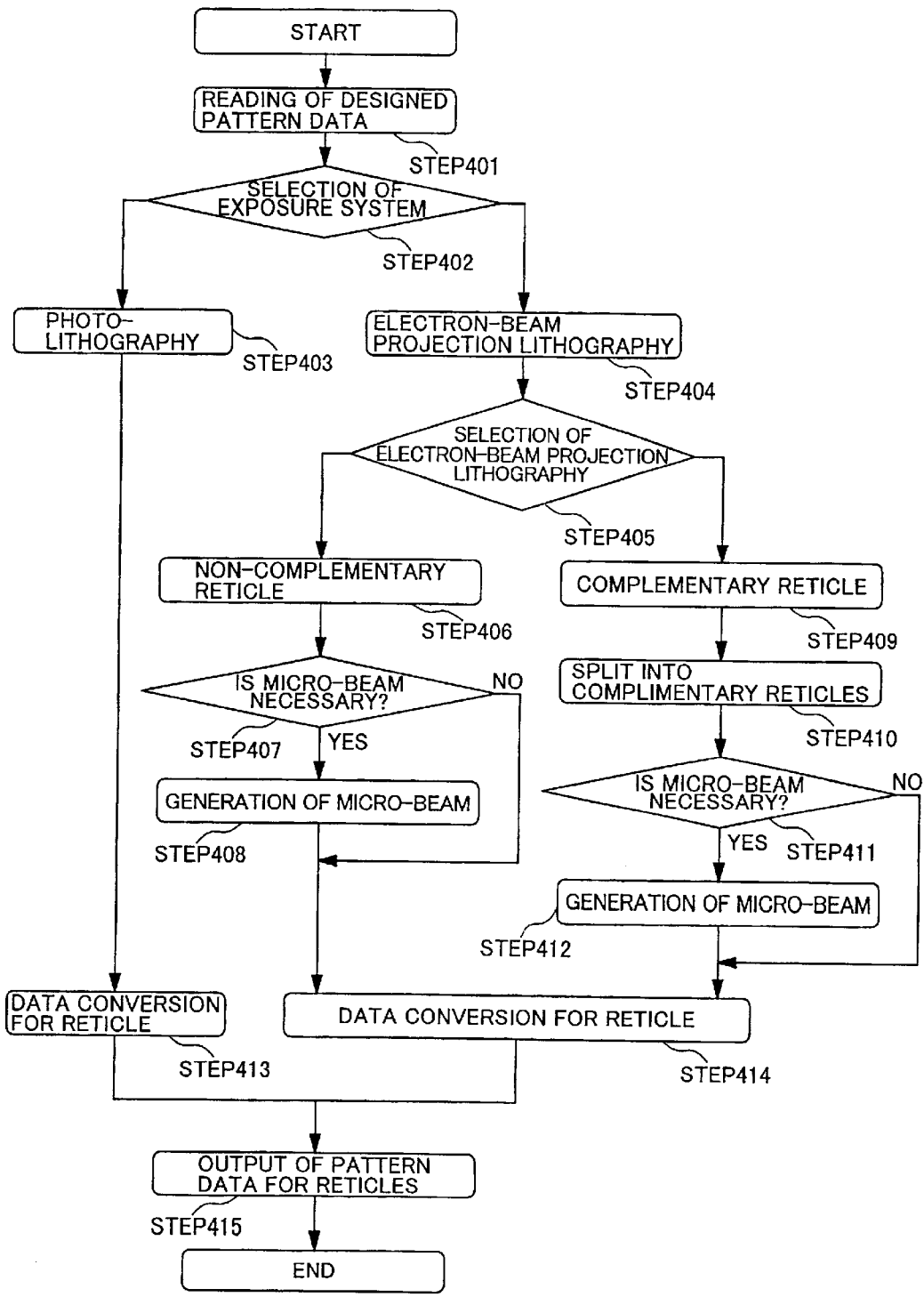

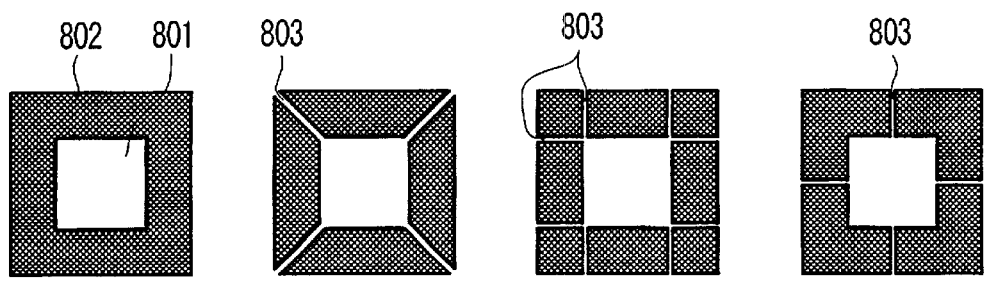
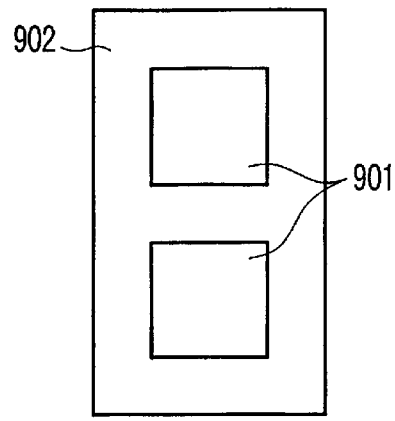
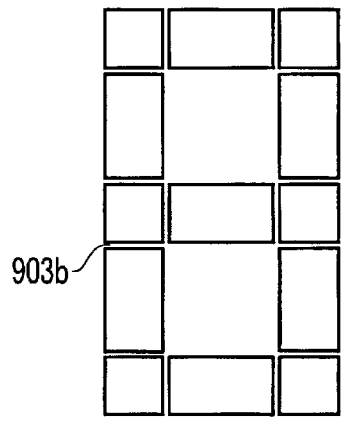
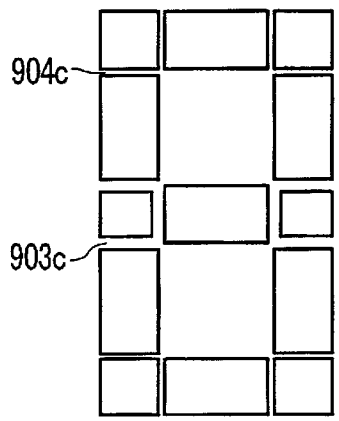
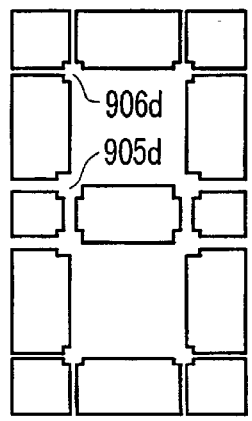

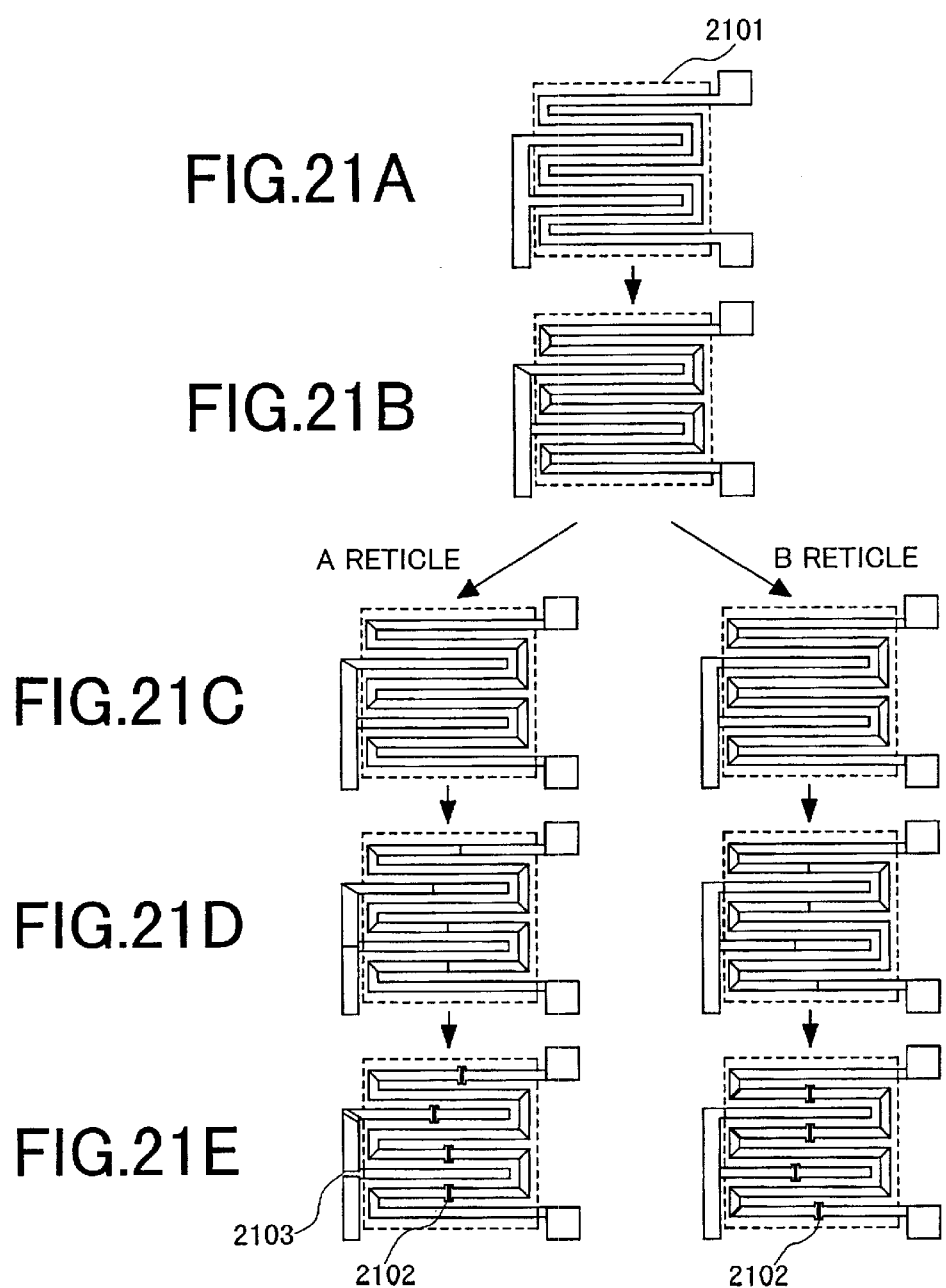

| E1 | E2 |    | J1 | J2 | O1 | O2 | T1 | T2 | Y1 | Y2 |
|----|----|----|----|----|----|----|----|----|----|----|
| D1 | D2 |    | I1 | I2 | N1 | N2 | S1 | S2 | X1 | X2 |
| C1 | C2 |    | H1 | H2 | M1 | M2 | R1 | R2 | W1 | W2 | ◁── 4302
| B1 | B2 |    | G1 | G2 | L1 | L2 | Q1 | Q2 | V1 | V2 |
| A1 | A2 | A3 | F1 | F2 | K1 | K2 | P1 | P2 | U1 | U2 |

FIG.45

| E2 |    |    |    |    |
|----|----|----|----|----|
| E1 | J2 | O2 | T2 |    |
| D2 | J1 | O1 | T1 | Y2 |
| D1 | I2 | N2 | S2 | Y1 |
| C2 | I1 | N1 | S1 | X2 |
| C1 | H2 | M2 | R2 | X1 |
| B2 | H1 | M1 | R1 | W2 | ◁── 4302
| B1 | G2 | L2 | Q2 | W1 |
| A3 | G1 | L1 | Q1 | V1 |
| A2 | F2 | K2 | P2 | V1 |
| A1 | F1 | K1 | P1 | U1 |

SEMICONDUCTOR DEVICE AND A MANUFACTURING METHOD OF THE SAME

BACKGROUND OF THE INVENTION

1. Field of the Invention

The present invention relates to a manufacturing method of a semiconductor device, which forms semiconductor integrated circuit patterns by using charged particle beams.

2. Description of the Related Art

A lithography technology has been used for pattern formation of a semiconductor integrated circuit. In such a case, a light, an electron beam or the like is used as an energy beam to expose a photo-sensitive film. In photolithography using a light as an energy beam, in order to deal with microfabrication of a semiconductor device, a wavelength of a light source has been made shorter from a g line (436 nm) to an i line (365 nm), and to KrF (248 nm). This has been carried out because of the fact that resolution of a micro pattern is increased in inverse proportion to a wavelength. In the photolithography, resolution has accordingly been increased by a shorter wavelength. However, performance of a photolithography device has become insufficient for a pattern size required as device performance. Thus, further shortening of a wavelength of the light source has been pursued so as to increase resolution. However, not only light sources but also new lens materials and resists must be developed, necessitating enormous development costs. Consequently, device prices and process costs are increased, creating a problem of a high price of a manufactured semiconductor device.

On the other hand, electron beam lithography using an electron beam as an energy beam has an advantage of high resolution capability compared with the photolithography. In the case of a conventional electron beam lithography device, however, writing was carried out on a resist on a wafer by coating (direct writing) with a point (rectangular) beam or connecting a mask pattern of only several $\mu$m×several $\mu$m. In the case of the conventional electron beam, an electron source for obtaining high-density electron beams was not provided, and uniform electron beams were not provided in a wide range. Alternatively, aberration occurred between a center portion and a peripheral portion in the case of projecting an area of a large area. Consequently, resolution was deteriorated, making it impossible to project patterns of large areas all at once. Therefore, in a conventional electron beam writing method, since writing is carried out while connecting very small areas, many shots are necessary for writing on one wafer. In addition, since time is necessary until stabilization after an electron beam is deflected to a predetermined position for each shot, the increased number of shots causes a reduction in throughput. For such a reason, throughput has conventionally been low, about several pieces per hour (in 8-inch wafer), proving the method to be unsuitable as a mass-production technology.

As one of the measures to improve throughput of the electron beam lithography, for example as described in pp. 6897 to 6901, Japan Journal Applied Physics, vol., 39 (2000), electron projection lithography has been presented, which forms all patterns on a mask original plate (referred to as a reticle, hereinafter), and then projects/transfers the patterns by using electron beams. In this electron beam projection lithography, a lens was developed, which prevents aberration from being generated even when high-density electron means are provided uniformly in a wide range, and large-area irradiation is carried out. As in the case of the photolithography, the development of the lens enables the mask to be irradiated with electron beams, and scanned, greatly reducing the number of shots. Thus, the electron projection lithography is similar to the photolithography in terms of projection, its image being similar to a change of a light source from a light to an electron beam. Compared with several pieces/hour of the conventional electron beam lithography, throughput of one digit higher, i.e., 35 pieces/hour (in 8-inch wafer) is estimated.

A shape of the reticle for electron beam projection is descried in, for example pp.214 to 224 of Proceedings of SPIE vol. 3997 (2000). FIG. 2A is a bird's eye view of a reticle for electron beam projection, FIG. 2B an expanded view of a area 203 of FIG. 2A, and FIG. 2C a view of the reticle seen from the above. The electron beam lithography has a limited projection range. Accordingly, circuit patterns constituting an LSI chip are divided at sizes 1000 $\mu$m$^\square$ on the reticle, and these circuit patterns are connected to form a pattern of the entire chip during projection. Hereinafter, one of such divided areas, i.e., a area on which the patterns are projected all at once, is referred to as a "subfield" 201. A wafer, on which the circuit patterns are projected, is continuously moved, and each pattern projection is carried out by mechanically moving a reticle stage and deflecting electron beams corresponding to the wafer movement. A thickness of silicon (Si) of a pattern portion of the reticle is thin, 0.5 to 2 $\mu$m, and consequently breaking easily occurs. Thus, a mechanical strength is increased by providing a silicon beam called a strut 202 between the subfields.

Now, a manufacturing flow of a reticle for electron beam projection is described by referring to FIGS. 3A to 3D. As shown in FIGS. 3A to 3D, a silicon-on-insulator (SOI) wafer having $SiO_2$ buried in a Si substrate is used. The substrate has a thickness of about 400 to 800 $\mu$m and, thereon, $SiO_2$ is deposited by 0.1 to 0.5 $\mu$m, and Si by 0.5 to 2 $\mu$m. As methods of manufacturing a reticle for electron beam projection, there are available a preceding back etching method for carrying out back etching of the substrate before formation of a reticle pattern to manufacture the strut 202, and a succeeding back etching method for carrying out back etching of the substrate later. Here, the preceding back etching method is described. In the preceding method, first, a area of the strut 202 is subjected to patterning, and dry etching is carried out. According to the preceding back etching method, a reticle pattern is formed after blanks for a stencil mask are made. Thus, since blanks for a stencil mask can be made and stored, and only surface machining is needed thereafter, turn around time (TAT) can be shortened.

On the other hand, in the succeeding back etching method, patterning is carried out on a normal thick substrate. Accordingly, the number of special steps for manufacturing an EPL mask is relatively small. However, if mismatching is present in membrane stress between an oxide film of an intermediate layer and silicon on the surface by execution of etching of back-side Si, which makes TAT longer, mask deformation may occur, causing a shift in projection position. This positional shift is prevented by adding boron or the like to an oxide film on the surface to generate tensile stress on the substrate surface as well, and reducing stress between the oxide film and the substrate. Both methods have own features different from each other as described above, and the preceding back etching method enabling TAT to be shortened is considered to be more suitable. The oxide film is removed after the execution of the back etching. Accordingly, membrane blanks for the reticle for electron beam projection are made (FIG. 3B). Then, circuit patterns are divided into predetermined subfields, and a resist pattern 301 is formed on the reticle for electron beam projection by a resist process (FIG. 3C). A predetermined pattern is formed by further carrying out dry etching. Lastly, the reticle for electron beam projection is made by carrying out cleaning (FIG. 3D). As described herein, the reticle having an opening pattern for passing the energy beam is called a stencil type.

SUMMARY OF THE INVENTION

Representative features of the present invention can be summarized as follows.

In the case of using the electron projection lithography device, throughput can be greatly improved up to 35 pieces/hour compared with the electron beam direct writing method. Compared with the conventional photolithography, however, the throughput is lower, about ½. In the case of the stencil-type reticle, since the opening pattern for passing the electron beam is provided, a "square-shaped" pattern called a doughnut-type pattern cannot be included. This is because the inside of the "square-shaped" portion is surrounded with the opening pattern, and thus no supports are present, causing it to fall. Therefore, to carry out pattern projection for one area, it was necessary to use a so-called complementary reticle for dividing patterns into two or more reticles, and executing electron beam projection for the same area by a plurality of times. In such a case, projection must be carried out twice for pattern projection of one area, and a reduction inevitably occurs in throughput. A current value of an electron beam must be increased in order to achieve high throughput. In such a case, repulsion between electron beams enlarges beam blur, lowering resolution. Accordingly, even if an electron projection lithography device that has been under development conventionally and now is used, it has been difficult to obtain throughput as high as that of the photolithography. Thus, there is a need to properly use the photolithography having high throughput, and the electron projection lithography having low throughput but high resolution. However, no effective proper using methods have been available.

In the electron projection lithography, it is necessary to properly use a complementary reticle having limited pattern constraints but low throughput, and a non-complementary reticle having many pattern constraints but high throughput. Thus far, however, no effective proper using methods have been presented. Therefore, objects of the present invention are to provide an effective method of properly using a photolithography device and an electron projection lithography device, and an effective method of properly using complementary and non-complementary reticles when electron projection lithography is used.

In the case of the reticle for electron beam projection, in a conventional reticle for cell-projection, a projection area is small, and a thickness of the reticle is about 10 μm, thus providing a high mechanical strength. However, a thickness of a reticle for electron projection lithography is about 2 μm or lower, which is very thin, and accordingly a mechanical strength is low. Further, since patterns are projected all at one on a large area of 1 mm or more, patterns having a large aspect ratio are formed in the opening pattern of the reticle. For example as shown in FIG. 20A, in a non-opening portion 2002 for scattering electron beams, openings 2001 for projecting patterns with electron beams non-scattered are densely formed at a large aspect ratio. Thus, a state before a cleaning step of the reticle was similar to that shown in FIG. 20A. After the cleaning step, however, as shown in FIG. 20B, surface tension of cleaning solution brought about bending 2003, chipping 2004, and adhesion of a foreign object caused by the chipping. Consequently, breaking or short-circuiting, and shifting in projection position occurred in a manufactured device circuit, creating a problem of impossible acquisition of initial performance.

The problems including the bending and the like have become conspicuous, because projection of patterns carried out all at once on the large area in the electron projection lithography device or the like has increased the aspect ratio of the transcribed patterns by 50 times or more, and a thickness of the stencil mask has become thin to 5 μm or lower. Therefore, another object of the present invention is to provide a method of setting a beam interval, which prevents bending in a stencil mask.

A micro-beam provided for the purpose of preventing bending or the like can be made sufficiently thin to make projection of the patterns difficult. However, this may cause a problem such as narrowing, where the transcribed patterns become large or small in size locally at the micro-beam portion. Therefore, another object of the present invention is to suppress pattern deformation at a micro-beam portion by providing a forming place, a shape and a material of an optimal micro-beam, and a projection method.

As described above, throughput and resolution greatly varied depending on projection devices and methods, and required throughput and resolution were never satisfied simultaneously. Thus, regarding the two types of devices, i.e., photolithography having high throughput, and electron projection lithography having throughput low compared with that of the photolithography but still relatively high, and a high resolution capability, the present invention presents a projection device and a projection method capable of obtaining highest throughput while satisfying required accuracy and required resolution for each type and layer. The invention also presents a method of manufacturing a semiconductor device, which makes effective selection of two types of projection methods, i.e., non-complementary and complementary reticles, so as to obtain highest throughput while satisfying required accuracy and required resolution, when the electron projection lithography device is selected.

According to the invention, the electron projection lithography device is used at layers such as an isolation layer, a gate level, a contact hole layer, and a wiring layer just after the gate level, where pattern formation is difficult by the photolithography device. At other layers to be sufficiently processed even by the photolithography, the photolithography is used. In this way, pattern projection is carried out.

According to the invention, conditions for selecting the photolithography and the electron projection lithography are decided depending on an exposure wavelength of the photolithography device and numerical aperture of an exposure system.

According to the invention, for products small in number to be processed by one reticle or products with quick turnaround time, e.g., in small volume products or research developments, a variable-shaped electron writing system or a cell-projection electron beam writing system needing no manufacturing of reticles is used to directly write a pattern on a sample. Thus, it is possible to reduce mask manufacturing costs, and shorten mask manufacturing time.

According to the invention, the electron projection lithography by the complementary reticle is used at the wiring layer just after the gate level or at a layer having a high ratio of a transcribed pattern area in a chip. Accordingly, an opening area of a pattern can be reduced by complementary splitting at the layer having the high ratio of the transcribed pattern area. Thus, it is possible to improve resolution.

According to the invention, in order to increase a strength of a reticle for electron beam projection, if a short size of a non-opening pattern is Wnm, and a spacing with a non-opening pattern adjacent to the same is Snm, then a micro-beam formation interval Lnm is set equal to/lower than a predetermined interval so as to set 0<L≦(S+W−50)×50. However, each size is represented by nano meters.

According to the invention, in order to increase a strength of a reticle for electron beam projection, a micro-beam forming place is set at an intersection portion between T-shaped opening patterns.

According to the invention, as a material of the micro-beam, a material having a low electron scattering coefficient compared with that of a material of a reticle non-opening area is used. Thus, charged particles scattered at the micro-beam are suppressed to prevent projection of the micro-beam.

According to the invention, in unit areas to be subjected to charged particle projection all at once, a width of a micro-beam in a unit area having a large opening area is set larger than that of a micro-beam in a unit area having a small opening area. Accordingly, a maximum micro-beam width can be set, which prevents projection in each unit area. Thus, mask manufacturing can be facilitated, and a mechanical strength of the mask can be increased.

According to the invention, even in the same unit area, a width of a micro-beam at a place of a large opening pattern width is set larger than that of a micro-beam at a place of a small opening pattern width. Accordingly, a maximum micro-beam width can be set, which prevents projection, according to each pattern. Thus, mask manufacturing can be facilitated, and a mechanical strength of the mask can be increased.

According to the invention, in order to prevent approaching between the micro-beam and a pattern edge, an area having a distance between the micro-beam and a non-opening pattern parallel to the micro-beam set less than 10 times of a width of the micro-beam is set as a micro-beam formation limiting area, and a position of the micro-beam is shifted so as to set the distance larger by 10 times or more than a width of the micro-beam. Thus, projection of micro-beam patterns caused by dense disposition of micro-beams can be suppressed.

According to the invention, an area within a predetermined range, particularly an area requiring high pattern size accuracy, e.g., a gate pattern portion on an active area, is set as a micro-beam formation limiting area. Thus, it is possible to prevent pattern failures caused by micro-beams within the predetermined range.

According to the invention, the micro-beam is disposed obliquely to a chip arraying direction, especially +45° or −45° to the chip arraying direction. Thus, a size changing amount at the micro-beam can be halved.

According to the invention, a first round of projection is carried out by using a mask including a micro-beam having a non-opening area connected, and an opening pattern width shortened by a predetermined amount in a direction orthogonal to the micro-beam. A second round of projection is carried out by using the mask, and shifting a projection position in a direction orthogonal to an arraying direction of the micro-beam. Thus, it is possible to suppress formation of patterns of micro-beams on the semiconductor substrate.

According to the invention, double exposure is carried out in a direction orthogonal to the micro-beam, and by using a reticle having an opening pattern width shortened by a predetermined amount in the same direction as a shifting direction. Thus, it is possible to suppress an increase in pattern size caused by the double exposure with positional shifting.

According to the invention, as a method of carrying out the double exposure, shifting exposure is carried out by a deflector. Thus, it is possible to carry out the double exposure at a high speed.

According to the invention, double exposure for suppressing projection of the micro-beam can be carried out by undulating a relative relation between an area to be projected by charged particles all at once, and the semiconductor device. Accordingly, it is possible to separately control projection position deflection and undulation for shifting exposure, achieving a simpler device configuration.

According to the invention, a reticle having a larger opening width of an opening pattern adjacent to the micro-beam is used. Thus, it is possible to suppress projection of a micro-beam pattern.

Other objects, features and advantages of the invention will become apparent from the following description of the embodiments of the invention taken in conjunction with the accompanying drawings.

BRIEF DESCRIPTION OF THE DRAWINGS

FIG. 1 is a flowchart showing a semiconductor device manufacturing method according to an embodiment of the present invention.

FIG. 4 is a flowchart showing generation of reticle data according to an embodiment of the present invention.

FIGS. 8A to 8D are views, each showing a forming place of a micro-beam on a doughnut-type pattern in a reticle for electron beam projection according to an embodiment of the present invention.

FIGS. 9A to 9D are views, each showing a forming place of a micro-beam on a doughnut-type pattern in a reticle for electron beam projection according to an embodiment of the present invention.

FIGS. 21A to 21E are views showing a micro-beam forming flow according to an embodiment of the present invention.

FIG. 44 is a view showing a method of arraying complementary reticles for electron beam projection according to an embodiment of the present invention.

FIG. 45 is a view showing a method of arraying complementary reticles for electron beam projection according to an embodiment of the present invention.

DESCRIPTION OF THE EMBODIMENTS

Figure 2A:
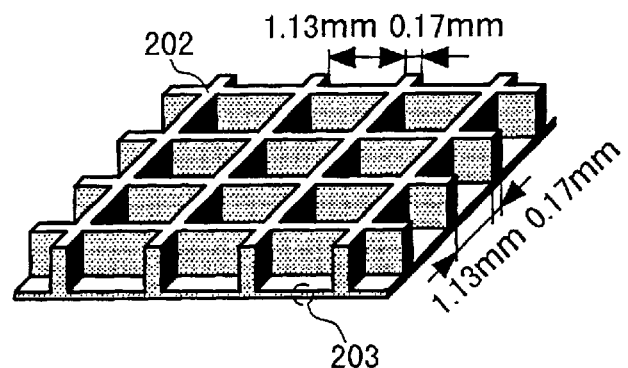
FIGS. 2A to 2C are views, each showing a reticle structure in electron projection lithography.

Next, detailed description will be made of the present invention. First, terms used herein are defined as follows.

Electron projection lithography (EPL): A method of using electron means as energy beam, and projecting a full surface of a predetermined layer of a semiconductor device using a reticle. Also called a electron beam stepper.

Cell-projection electron beam writing: A system of using electron beams as energy beam, having a particular pattern preset as a reticle, and carrying out projection by repeatedly using the particular pattern. Also called a cell-projection system, a block system, a character-projection system, and the like. For a pattern unmade into a reticle, projection is carried out by using variable-shaped electron beams. Electron beam direct writing: While electron beam writing for manufacturing a reticle is called electron beam mask writing, this method is called as such because it directly projects a pattern on a semiconductor substrate. Thus, the electron projection lithography is also included in this electron beam direct writing. Herein, however, electron beam direct writing other than the electron projection lithography is called an electron beam writing system. This system includes Gaussian electron beam writing, and variable-shaped electron beam writing.

Complementary reticle: In electron projection lithography, a method of dividing a pattern of a predetermined area into two or more reticles for manufacturing, and projecting the reticles on the same area on a semiconductor substrate, or its reticle. Non-complementary reticle: A method of projecting patterns of a given area all at once, or its reticle.

Coulomb effect: An effect generated by repulsion of coulomb forces between electrons, beam blur is generated by bending of an electron orbit, causing a reduction in resolution capability. This effect is enlarged as a current value is increased.

Micro-beam: A very small non-opening pattern for connecting both ends of an opening area of a reticle. As this micro-beam has only a very small width, no patterns are projected even if pattern-projection is carried out. Even if projected, no circuit problems are created.

Back scattering: Electron beams made incident on a semiconductor substrate are scattered by clashing with atoms to supply energy to the substrate by being spread from a point of incidence. Thus, energy is supplied to other than the point of incidence, and an area of a high pattern density receives influence of a peripheral pattern, increasing its effect.

Hereinafter, detailed description will be made of the embodiments of the present invention with reference to the accompanying drawings.

(First Embodiment)

First, by referring to FIG. 1, description is made of a method of manufacturing a semiconductor integrated circuit device according to a first embodiment of the present invention. A step 101 is a pattern projection step of projecting a reticle pattern formed on a reticle onto a wafer. A step 102 is a step of carrying out various operations such as etching, introduction of impurities, and deposition. In a normal semiconductor integrated circuit device, pattern projection and various operations are repeated until all the operations are determined to be completed (step 103).

According to the embodiment, in step 101 of pattern projection, an exposure system is selected from photolithography (step 101b) and electron projection lithography (step 101c) (step 101a). In this case, the exposure system is selected so as to obtain highest throughput while satisfying required accuracy and required resolution for each product/layer. For example, layers of a hole pattern, an ultra-micro pattern, and a random micro pattern difficult to be projected by photolithography are formed by electron projection lithography, and other layers by photolithography. To cite specific layer names, a contact hole layer, an isolation layer, a gate level, and a wiring layer just after the gate level are formed.

The above-described layers need not always be formed by the electron projection lithography. The photolithography or the electron projection lithography may be selected depending on a processing size or processing accuracy. Resolution of the photolithography depends on an exposure wavelength λ, and a numerical aperture NA of an exposure system. If a constant is h (described later), then a resolution capability W1 of the photolithography is represented by $W1 \geq h \times (\lambda/NA)$ (equation (1)). The constant h varies depending on a type of a reticle for photolithography. Constants h are different between a normal reticle having reticle patterns composed of an opaque pattern made of metal and a clear pattern, and a phase-shifting reticle having means for generating a phase difference in an exposure light transmitted through the reticle. In the case of the normal reticle, h=0.5 is set. In the case of the phase-shifting reticle, h=0.25 is at a minimum while it is slightly changed depending on methods. In other words, a minimum pattern size range to be projected by photolithography is set by applying $0.25 \leq h \leq 0.5$ to h of the equation (1). Thus, pattern projection is carried out by using the photolithography having high throughput if a minimum processing size of a pattern to be projected satisfies the above-described equation, and the electron projection lithography having high resolution if less than the equation.

When the electron projection lithography is selected (step 101c) as shown in FIG. 1, effective selection is made of the non-complementary reticle (step 101f) or the complementary reticle (step 101g) (step 101e). The selection of the projection system, the complementary reticle or the non-complementary reticle, is carried out mainly depending on a size of an opening area in a subfield. If an opening area is large, a current value is large, and beam blur occurs because of a coulomb effect of electron beams, lowering resolution. Accordingly, to form a micro pattern by using the electron projection lithography device, a method for reducing a current density or reducing an opening area of one reticle by using the complementary reticle may be employed. If a current density is changed, lens conditions of the device must be set all over again, requiring time until stabilization after the setting. Consequently, an operation rate of the device is reduced. If an opening area is large, since many long patterns are inevitably formed, a mechanical strength of a reticle is reduced. In this case, even if a micro-beam is provided, it is difficult to obtain a sufficient mechanical strength. Thus, the use of the complementary reticle is advantageous as it improves resolution as well.

Therefore, the conditions for selecting the complementary reticle or the non-complementary reticle are changed depending on a mask opening ratio (ratio of opening in a subfield) or a ratio of projection (ratio of pattern projection in a chip). When a pattern projection area in the chip exceeds 10 to 30% as such a condition, the influence of a coulomb effect is enlarged. Accordingly, when this range is exceeded, an opening area of the reticle can be halved by, for example a complementary reticle divided into two. Even if a pattern projection area in the chip is lower than 10 to 30%, balance between an opening area and a non-opening area in the chip is bad, and consequently many subfields having high pattern densities may be formed locally. In this case, even if an increase of a mechanical strength is tried by using a micro-beam, a sufficient strength cannot be obtained, and thus the complementary reticle is divided. Accordingly, a reticle is prepared by a non-complementary reticle when the number of subfields having numerical apertures of 10 to 30% is 70 to 100%. When this rate is exceeded, a complementary reticle is used. To cite specific names, a non-complementary reticle is used for the isolation layer, the gate level and the contact hole layer. A complementary reticle is used for the wiring layer just after the gate level.

Most of patterns in the contact hole layer are holes. Thus, a current value is small, causing no problems of a reticle mechanical strength. In the contact hole layer, however, problems may also occur, including mid-pattern falling when there are doughnut type patterns, bending when there are long patterns on the peripheral circuit, and the like. Use of a complementary reticle for such partial patterns brings about a reduction in throughput. In such a case, by providing a micro-beam to reinforce the reticle, pattern projection by a non-complementary reticle can be carried out. Forming places and methods for micro-beams will be described later with reference to the other embodiments.

Further, a predetermined resist is coated on a main surface of the wafer according to each projection device/layer (step 101*d*) (step 101*a*). Then, the wafer is pattern-projected by each projection method (step 101*h*). Subsequently, a resist pattern is formed on the wafer through heat treatment, development and the like (step 101*i*).

Thus, by properly using the projection device based on each selection condition, it is possible to achieve high throughput.

The micro-beam can be applied to a complementary reticle. Normally, to divide the complementary reticle, it is carried out so as to obtain a sufficient mechanical strength, and to prevent formation of doughnut type patterns. However, because of a problem of a mechanical strength, difficulty of complementary reticle division, and the like, sufficient division may not be made by two complementary reticles, necessitating three or four complementary reticles to be used. Also in such a case, the number of reticles can be reduced by providing a micro-beam. For both of the first and second selections (selection of exposure system) and (selection of projection method in electron projection lithography), predetermined selection values (predetermined values) are entered by an exposure operator. However, no limitations are placed on this. For example, predetermined values may be set based on past yield, or by a method of specifying from a file or the like.

In the embodiment, as a first selection of an exposure system, electron projection lithography or photolithography is selected. In addition, electron beam direct writing may be added to options. The electron beam direct writing has a feature of non-necessity of reticles while throughput is extremely low (in the case of cell-projection electron beam writing, patterns having high appearance rates must be made beforehand). Accordingly, considering reticle manufacturing costs and the number of exposed wafers (the number of times of exposure) by one reticle, manufacturing may be less costly if the electron beam direct writing is selected. Specific examples may be a small volume of products, and device developments. The other advantage is the non-necessity of reticles, which can shorten a period of reticle manufacturing. Thus, the system is effective for products with quick turnaround time.

In each step, an article is carried by a human operator to a next device based on an identification mark attached to a wafer or a case classified for each product, and several conditions are set. However, no limitations are placed in this regard. For example, an identification mark similar to a bar code may be read automatically or with human assistance, a device for next processing may be determined, and then the article may be carried thereto. Automatic setting of conditions may be executed for parts of processing steps, or all steps.

As described above, according to the embodiment, the exposure system of high throughput is preferentially selected and, when projection is difficult because of pattern constraints or the like, the exposure system of next high throughput is selected. Thus, it is possible to obtain a highly accurate semiconductor device with higher throughput.

(Second Embodiment)

Next, description will be made of a method of generating reticle data by referring to FIG. 4. Image data of each layout data is read (step 401), and an exposure system is selected in step 402. For selection conditions in this case, selection is made by processing the fetched image data, and based on various selection conditions. Here, a photolithography device is selected if a minimum size is 0.3 $\mu$m or higher (step 403), and an electron projection lithography device is selected in other cases (step 404). When photolithography is selected, reticle data is generated as usual (step 413), and this reticle data is outputted (step 415). When electron projection lithography is selected, the image data is processed, and selection is made based on a selection condition as to use of a non-complementary reticle or a complementary reticle (step 405). Selection conditions in this case are as follows. That is, when a pattern projection area is equal to/lower than 30% of a chip area, or when the number of subfields each having an opening area therein exceeding 30% exceeds 20% of the number of all subfields in the layout data, the complementary reticle is selected (step 406), and the non-complementary reticle is selected when it is lower than 20% (step 409). This is because if a chip area or an opening area of a subfield exceeds 30%, a pattern density is high, thus causing easy bending. If a micro-beam is provided in such a pattern, an effect of increasing a mechanical strength by the micro-beam is small, or reticle manufacturing time for manufacturing a micro-beam is extended. Consequently, reticle costs are increased. Thus, division into complementary reticles is more advantages in terms of costs and accuracy.

Then, when the non-complementary reticle is selected, determination is made as to necessity of a micro-beam (step 407). If necessary, a micro-beam is formed (step 408), and then reticle data is generated. If not necessary, no micro-beams are formed, first reticle division is carried out (step 410) and, then, as in the case of the complementary reticle, determination is made as to necessity of a micro-beam (step 411). A micro-beam is formed (step 412), and then reticle data is generated (step 412). If not necessary, no micro-beams are formed, and reticle data is generated. If the photolithography is selected in the first selection, a normal method of generating reticle data is used. Then, reticle data is outputted (step 415).

It may be more advantageous if an operator verifies the formation of patterns without any problems on a display after the generation of the layout data. For example, by discriminating color or a design of a micro-beam from other patterns, verification may be facilitated as to whether the micro-beam is present in a proper place or not, alternatively whether the micro-beam is always located in a necessary place or not as in the case of a doughnut type pattern. Further, by changing colors or designs of micro-beams according to priority, more detailed verification can be made as to the reticle data. For example, as in the case of the doughnut type pattern, high priority is given to a place always needing a micro-beam. Alternatively, display colors or designs of a micro-beam formation limiting place and an area may be changed from other patterns or micro-beams. For example, as in the case of the gate pattern on an active area, a display color/design of a place or an area greatly affecting a device characteristic even by slight size fluctuation is changed. Accordingly, deterioration of device performance can be suppressed by the micro-beam.

In the present embodiment, the second selection is made after the first selection. However, since results of determination under various conditions can be easily obtained when the image data is processed, steps 402 and 405 are simultaneously carried out omitting step 404. In other words, selections of the photolithography, the non-complementary reticle for electron projection lithography, and the complementary reticle for electron projection lithography can be carried out simultaneously. Also, in the embodiment, the first selection is made at a minimum processing size, and a condition for the second selection is an opening area of a projection reticle. However, no limitations are placed in this regard.

Selection may be made under various conditions. For example, the electron projection lithography is used when any one of the followings applies, i.e., a noncyclical pattern of 0.3 μm or lower, a cyclical pattern of 0.2 μm or lower, and a hole pattern of 0.35 μm or lower. The photolithography is used when all the conditions are outside the range. This is because resolution greatly varies depending on a pattern type in the case of the photolithography. Therefore, by making selection according to combinations of various conditions, it is possible to carry out optimal selection for obtaining highest throughput while satisfying required accuracy and required resolution. If a plurality of photolithography devices different in performance are owned, or a method of changing a projection capability by changing a reticle structure is added to options, only conditions of selection are increased, and thus the present invention can be applied.

(Third Embodiment)

Figure 5A:
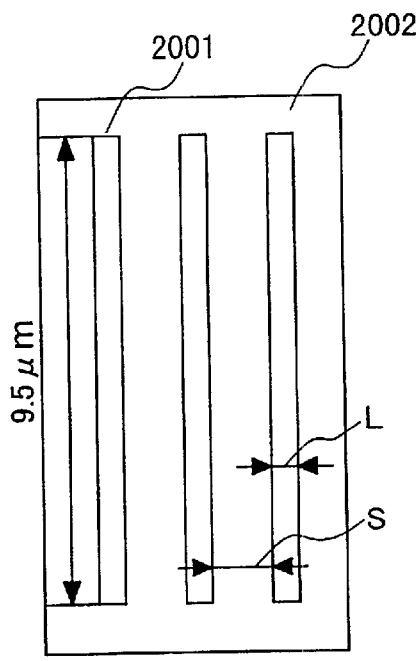
FIGS. 5A and 5B are views, each showing dependence of bending on an opening size in a reticle for electron beam projection.
Figure 5B:
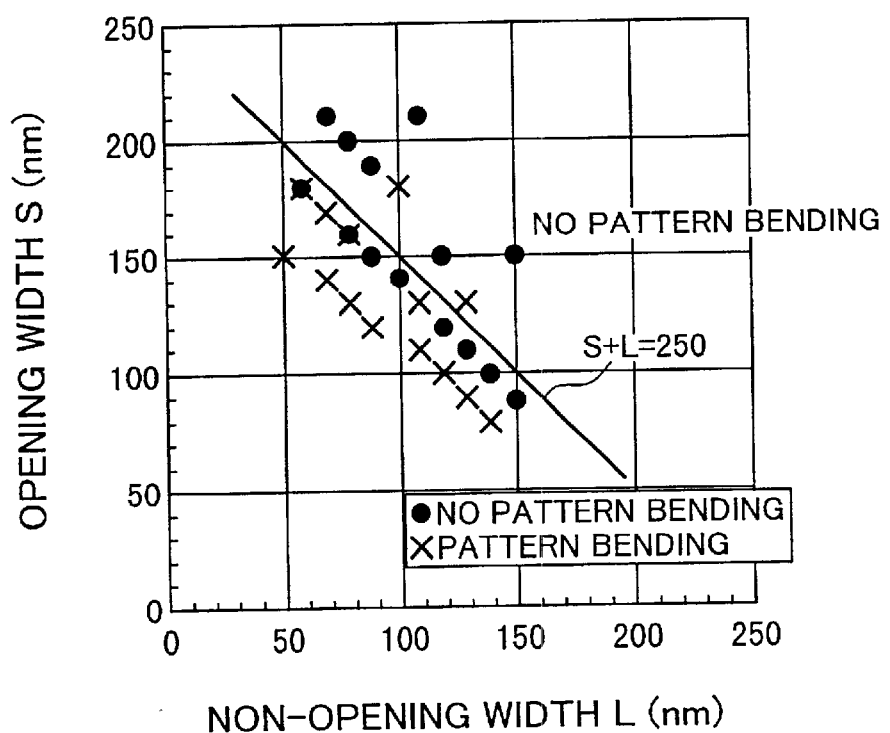

In the embodiment described herein, for all pattern sizes, sizes converted on a wafer are used unless otherwise specified. Thus, for example in the case of projection by downsizing of ¼, a size on a reticle takes a value larger by 4 times than a size on the wafer. Now, by referring to FIGS. 5A and 5B, description is made of a micro-beam forming place according to an embodiment of the present invention. The drawings show presence of bending when the maximum number of patterns can be disposed in a range of 9.5 μm at a predetermined pitch, a pattern length being equal to a size 9.5 μm on the wafer. As shown in FIGS. 5A and 5B, if an opening width S is constant, a non-opening width L becomes short to cause bending. This occurs because the short non-opening width L reduces a mechanical strength.

On the other hand, if a non-opening width L is constant, bending occurs as the opening width S becomes shorter. This bending occurs because surface tension is generated between non-opening patterns in a cleaning step after etching of a reticle pattern, and this surface tension is increased as the opening width is reduced. A relation between the surface tension and the mechanical strength shows dependence of bending on a sum of the opening width S and a non-opening width W, i.e., a pattern pitch. Here, bending occurs when a pattern pitch becomes equal to/higher than 250 nm.

Figure 6:
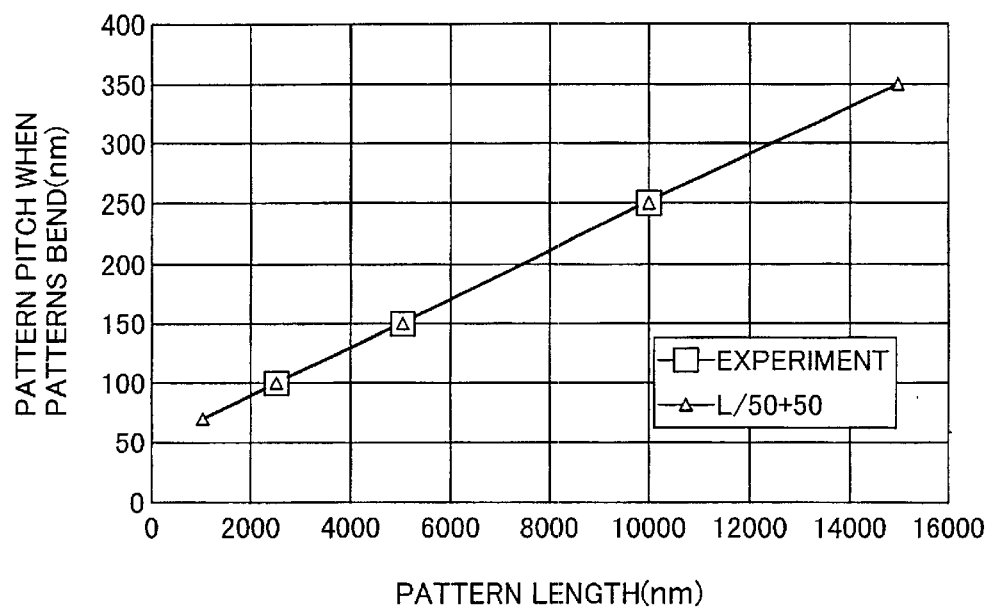
FIG. 6 is a view showing dependence of bending on an opening pattern length in the reticle for electron beam projection.

FIG. 6 shows a relation between a pattern length and a pattern pitch. As shown in FIG. 6, as a pattern length is longer, a pattern pitch for generating bending is larger. Accordingly, an interval of forming micro-beams must be decided in accordance with the pattern pitch. That is, if a size of a non-opening pattern is W, a spacing between the non-opening pattern and a adjacent pattern is S, and a length of an opening pattern between micro-beams is L, then from a result of FIG. 6, S+W≧L/50+50 must be set. However, units of S, W and L are all nm (nano meters). Further, by reducing the pattern length L from the above value by least ⅕ or lower, bending can be reduced to 0 for all in a chip. On the other hand, if a formation density of micro-beams is high (interval of forming micro-beams is short), scatterings at the micro-beams affect each other, increasing a possibility of micro-beam projection or pattern narrowing at the micro-beam in the image on wafer. Thus, a distance between micro-beams must be set larger by at least 10 times or more than a micro-beam size. A shape, a size and the like of the micro-beam will be described with reference to the other embodiments. As described above, by setting the interval of micro-beams according to the embodiment, it is possible to manufacture a reticle for electron projection lithography having no bending.

(Fourth Embodiment)

Figure 7A:
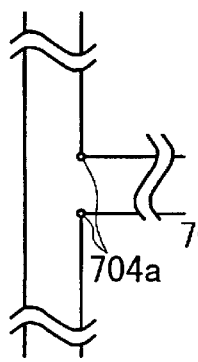
FIGS. 7A to 7H are views, each showing a forming place of a micro-beam on a bent pattern in a reticle for electron beam projection according to an embodiment of the present invention.
Figure 7B:
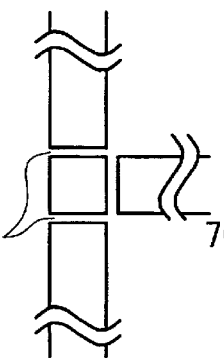
Figure 7C:
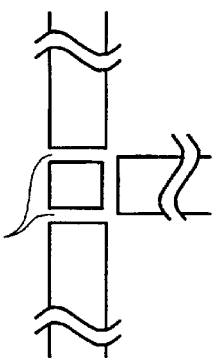
Figure 7D:
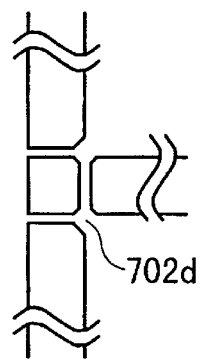
Figure 7E:
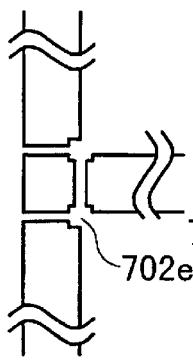

Next, by referring to FIGS. 7A to 7H, description will be made of a micro-beam forming place according to an embodiment of the present invention. FIG. 7A shows a design pattern. If a reticle is manufactured directly with this design data, bending easily occurs at a corner 704a of a non-opening pattern because stress is released. FIGS. 7B to 7H show examples of measures taken to deal with this bending. In FIG. 7B, a predetermined pattern is divided into rectangles, one or both of intersected portions of rectangular patterns are reduced by predetermined amounts, and a micro-beam 701b is formed. This method can be easily carried out by using conventional design automation (DA). In FIG. 7C, a downsizing amount of an area having a high pattern density is increased, for example at an intersected portion of patterns, increasing a size of a micro-beam 701C. In the area of a high pattern density, back scattering makes it difficult to project a micro-beam even if the micro-bema is made thick. By increasing a micro-beam size, it is possible to increase the effect of preventing bending by the micro-beam. For example, a micro-beam size must be set to 20 nm in order to set narrowing of a transcribed pattern by the micro-beam to 30 nm or lower at an isolated pattern of 200 nm (wafer-shaped size, and similar hereafter). However, at dense patterns, a micro-beam size can be set to 30 nm. In FIG. 7D, chamfering 702d is carried out at an intersected portion of rectangular opening areas. By formation of such a pattern, concentration of stress at the intersected portion of patterns can be reduced more. In FIG. 7E, chamfering 702e is carried out in a rectangular shape. Since no diagonal drawings are present as shown in FIG. 7E, reticle manufacturing is facilitated. This is because the electron beam mask writing is not good at diagonal drawing, and wiring time takes long.

Figure 7F:
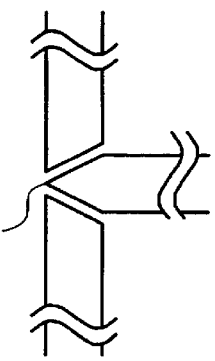
Figure 7G:
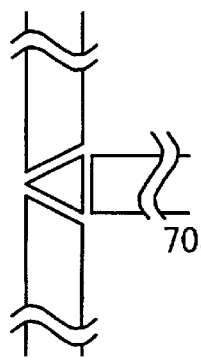

In FIGS. 7B to 7E, there are two places of micro-beams formed for the non-opening area on the straight-line portion of the left end of the opening area. In FIG. 7F, however, a micro-beam for the non-opening area on the straight-line portion of the left end of the opening area is only at a place 703f. Accordingly, it is possible to suppress narrowing after pattern projection by the micro-beam on the left end portion. In FIG. 7G, a micro-beam is provided such that an opening area becomes triangular at an intersected portion of three sides. The method of the embodiment enables stress at the corner to be reduced more.

Figure 7H:
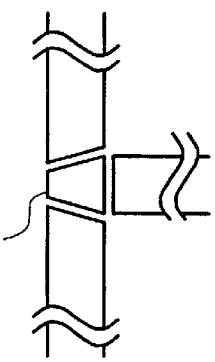

In FIG. 7H, compared with FIGS. 7F and 7G, an angle of a non-opening pattern 703h becomes obtuse. Accordingly, since the number of acute-angle patterns can be reduced, it is possible to suppress deterioration of transcribed patterns caused by roundness of the patterns. In the embodiment, patterns are shown only partially. If a pattern length is long, this can be dealt with by forming a micro-beam as described above with reference to the third embodiment.

(Fifth Embodiment)

Next, an example of applying a micro-beam to a doughnut type pattern is described. As shown in FIG. 8A, since nothing is present to support a non-opening area 801 in an opening area 802, the doughnut type pattern itself cannot be independent. Accordingly, for example as shown in FIGS. 8B and 8C, the non-opening area can be supported by providing a micro-beam 803 at a corner of the opening area. This is because in the opening area similar to an area of a high pattern density, e.g., at a corner exceeding 180°, back scattering makes it difficult to project the micro-beam as in the case of the fourth embodiment. Other than FIGS. 8B and 8C, by a combination with a micro-beam made in the third embodiment, the doughnut type pattern can be dealt with. Moreover, the number of micro-beams is small, i.e., 4, in FIG. 8B, and thus it is possible to suppress dense disposition of patterns.

On the other hand, the number of micro-beams is 8 in FIG. 8C. Accordingly, a mechanical strength can be increased more than that in FIG. 8B. If a doughnut type pattern is large, and a mechanical strength becomes short, an interval of forming micro-beams is made shorter than that, for example on a line pattern, thereby increasing a mechanical strength. For example, if micro-beams are normally provided at an interval of 4 μm, a reticle strength can be increased by providing micro-beams at a short interval, 1 μm, in the case of the doughnut type pattern. If micro-beams are provided at the corners as shown in FIGS. 8B and 8C, membrane stress is applied too strongly. Consequently, even if micro-beams are provided, a mechanical strength may become weak, creasing a possibility of micro-beam breaking. In such a case, as shown in FIG. 8D, by providing micro-beams in places other than the corners, membrane stress can be reduced.

(Sixth Embodiment)

Next, description will be made of an embodiment of applying the present invention to a continuous doughnut type patterns by referring to FIGS. 9A to 9D. As shown in FIG. 9A, the combinations of the third to fifth embodiments can be used also for the continuous doughnut type pattern. In FIG. 9B, an opening area 902 of FIG. 9A is divided into rectangular patterns, and a micro-beam 903b is formed at a connection portion between the rectangular patterns. This method facilitates formation of micro-beams. In FIG. 9C, a width of a micro-beam 903c in a place where one rectangular pattern is in contact with three or more rectangular patterns on the doughnut type pattern is set larger than that of another micro-beam 904c. In this case, a pattern size is 300 nm, and a size of the micro-beam 903c is set to 35 nm while that of the micro-beam 904c is 25 nm. In the place where one rectangular pattern is in contact with three or more rectangular patterns, a proximity effect makes projection difficult even if the micro-beam is made thick. Thus, a mechanical strength can be increased. In FIG. 9D, at a corner 905d of a place where one rectangular pattern is in contact with three or more rectangular patterns, a size of chamfering at the other inner corner 906c is set large. At the intersected portion of three rectangular patterns, a proximity effect makes it difficult to project a micro-beam. Thus, an amount of chamfering can be increased, and therefore a mechanical strength can also be increased. Here, a pattern size is 300 nm, and a size of 905d is set to 50 nm while a size of one side of 906d is 35 nm. Even if the amount of chamfering shown in FIG. 9D is not changed, an effect of increasing the mechanical strength of the micro-beam is still provided.

According to the embodiment, it is possible to manufacture a reticle having no middle falling or bending for two or more continuous doughnut type patterns.

(Seventh Embodiment)

Next, description will be made of an embodiment of applying the present invention to dense disposition of long patterns by referring to FIGS. 10A to 10F. In FIGS. 10A to 10F, left sides indicate reticle patterns when micro-beams 1001a to 1000f are formed based on reticle design data, and right sides indicate resist patterns resulted from electron projection lithography, 1002a to 1002f representing narrowing of patterns by the influence of micro-beams. Opening pattern sizes from FIGS. 10A to 10E are set to 120 nm, an opening size of FIG. 10F is set to 100 nm, 20 nm smaller, and micro-beam sizes are all set to 20 nm. For respective micro-beam shapes, narrowing is 30 nm at 1002a, 25 nm at 1002b, 18 nm at 1002c, 15 nm at 1002d, and 5 nm or lower at both 1002e and 1002f. A size of a projection-shaped micro-beam at 1001e is 25 nm vertically and 20 nm horizontally. A size of a projection-shaped micro-beam at 1001f is 25 nm vertically and 30 nm horizontally.

Figure 10A:
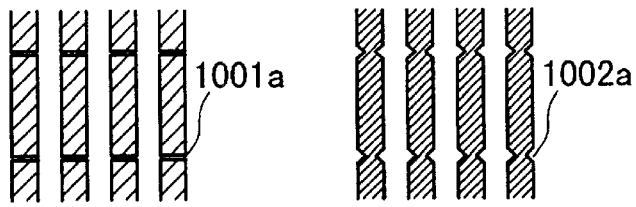
FIGS. 10A to 10F are views, each showing a forming place of a micro-beam on a continuous long pattern in a reticle for electron beam projection according to an embodiment of the present invention.
Figure 10B:
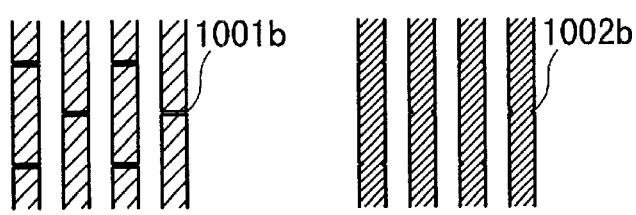
Figure 10C:
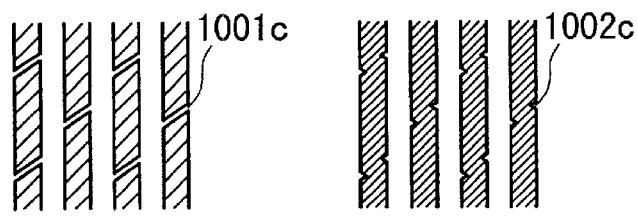
Figure 10D:
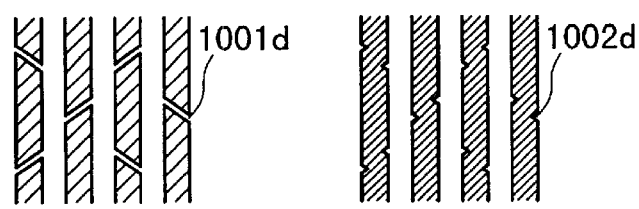
Figure 10E:
Figure 10F:

As shown in FIG. 10A, at densely disposed line patterns, the micro-beams 1001a affect each other to reduce the amount of an original proximity effect and, as a result, narrowing 1002a may be enlarged. In such a case, as shown in FIG. 10B, micro-beam forming places are formed into Amida shape of a ladder where horizontal lines connecting vertical lines parallel to each other are alternately arranged. Accordingly, the influence of the micro-beams on each other is reduced, making it possible to reduce narrowing. Alternatively, as shown in FIG. 10C, a diagonal micro-beam 1001c is formed, and thus places of narrowing 1002c can be set asymmetrical left and right. Such asymmetricity left and right enables line width reduction at a narrowing portion to be reduced by about ½ compared with a micro-beam perpendicular to an opening pattern. FIG. 10D shows a case of changing a direction of a diagonal micro-beam. As shown in FIG. 10D, by changing the direction of the micro-beam, it is possible to reduce direction dependence of stress, and increase a mechanical strength. FIG. 10E shows a case of providing a projection 1003e at a micro-beam. As shown, by providing small projections in both directions at the micro-beam, compared with a case of no projections, it is possible to greatly reduce or eliminate narrowing. FIG. 10F shows a case where a projection 1003f is provided at a micro-beam, and a width of an opening area is set narrow beforehand. In this case, in pattern projection, patterns are projected into proper sizes by increasing the amount of irradiation more compared with that of a case where the width of the opening area is not set narrow. As shown in FIG. 10F, since a narrow place of a non-opening area on a reticle generated by the projection of the micro-beam can be eliminated, a mechanical strength at the micro-beam can be increased. The method of reducing the influence of the micro-beam by setting narrow the width of the opening area beforehand and increasing the amount of irradiation as shown in FIG. 10F is also effective at other micro-beams. However, a combination can remove almost all the influences of the micro-beams.

The embodiment described above with reference to FIGS. 10B to 10E is not only effective for the normal line pattern but also for the densely disposed patterns.

(Eighth Embodiment)

Figure 11A:
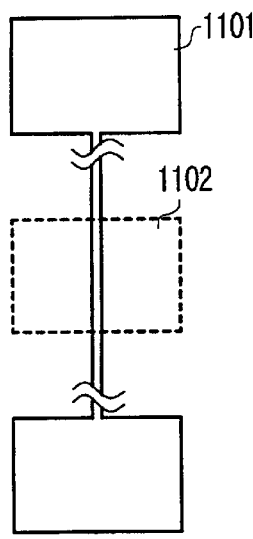
FIGS. 11A to 11F are views, each showing a forming place of a micro-beam when a limitation is placed on micro-beam forming places in a reticle for electron beam projection according to an embodiment of the present invention.
Figure 11B:
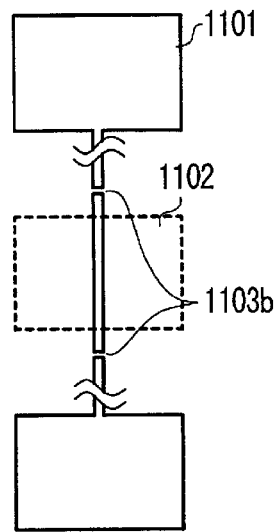
Figure 11C:
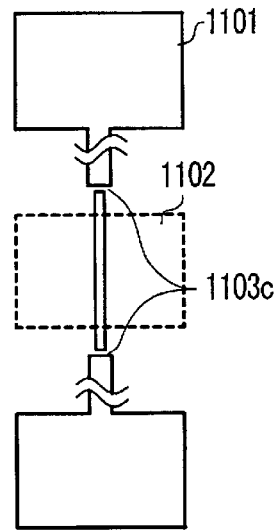

Each of FIGS. 11A to 11F shows an example of applying the present invention to a gate level requiring high size accuracy as a micro-beam forming method. As shown in FIG. 11A, if fluctuation occurs in a gate size of a gate pattern 1101 of 70 nm on an active area 1102, device performance is greatly affected. Accordingly, size fluctuation by a micro-beam on this area must be suppressed. In such a case, as shown in FIG. 11B, the active area 1102 is set as a micro-beam formation limiting area and, out of the active area, a micro-beam 1103b is formed. In this case, a multiple layer alignment error with other layers is considered, and a micro-beam forming place is separated from the active area at least by an amount equal to the overlay alignment error.

As shown in FIG. 1C, out of the active area 1102, by doubling a line width to 140 nm, narrowing or disconnection by a micro-beam 1103c can be eliminated. Alternatively, if micro-beams must be formed in the active area according to a predetermined micro-beam forming condition, pattern narrowing can be reduced by forming micro-beam shapes shown in FIGS. 10D to 10F of the seventh embodiment, for example in the case of long opening patterns. FIG. 10D of the embodiment shows a case of providing a projection 1103d at a micro-beam. Here, a beam size is 20 nm, and one size of the projection is 20 nm vertically, and 20 nm horizontally. By providing such a projection-shaped micro-beam, narrowing at the micro-beam can reduced to 5 nm or lower.

Figure 11D:
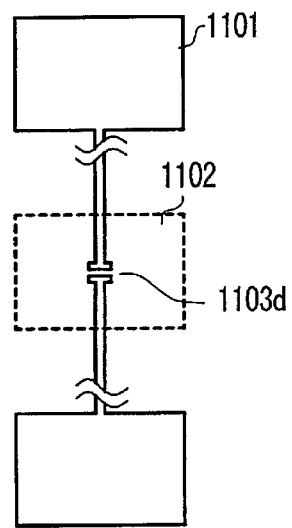
Figure 11E:
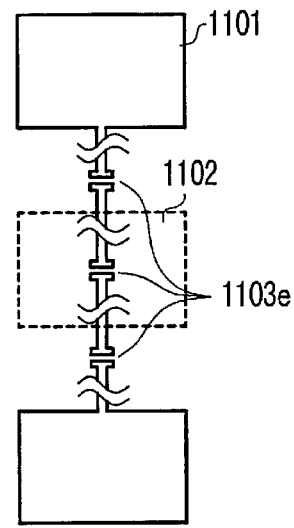
Figure 11F:
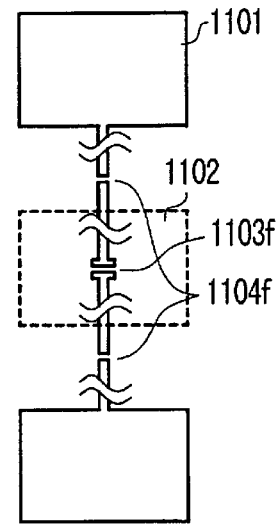

As shown in FIG. 11E, if a gate length is long, as in the case shown in FIG. 11D, a plurality of micro-beams 1103e are provided. Preferably, the micro-beams in this case are provided such that the number of micro-beams in the active area is smallest. This is for the purpose of reducing a possibility of adversely affecting a device characteristic by fluctuation in a gate size if only a little, by reducing the number of micro-beams as much as possible. A shown in FIG. 11F, in an area requiring high size accuracy, e.g., the gate on the active area, a micro-beam 1103f having a projection similar to that shown in FIG. 11E, and a micro-beam 1104f having no projections in the other area are provided. Thus, by reducing the number of micro-beams including projections as complex patterns, it is possible to shorten writing time for reticle manufacturing.

(Ninth Embodiment)

Figure 12A:
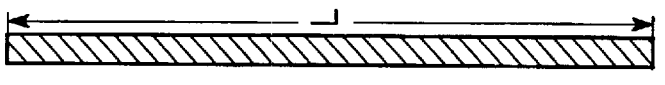
FIGS. 12A to 12F are views, each showing a forming place of a micro-beam on a long pattern in a reticle for electron beam projection according to an embodiment of the present invention.
Figure 12B:
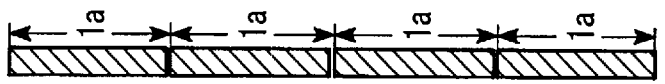
Figure 12C:
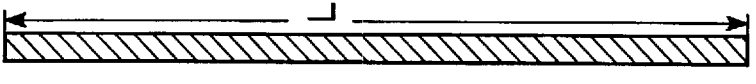
Figure 12D:
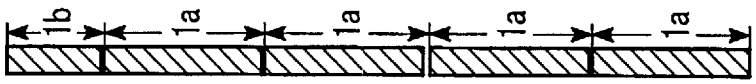
Figure 12E:
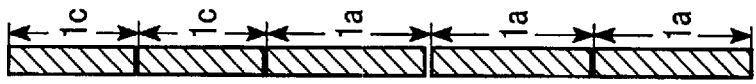
Figure 12F:
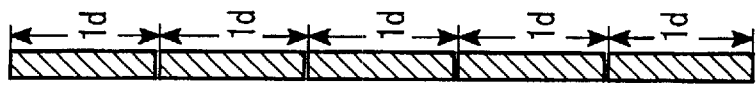

FIGS. 12A to 12F show an embodiment where micro-beams are formed on long patterns. If an opening pattern length is L as shown in FIG. 12A, assuming an interval of forming micro-beams to be 1a, then the number L/1a of micro-beams are formed as shown in FIG. 12B. A size of 1a in this case may be decided based on a graph of FIG. 6 as in the case of the third embodiment. If a pattern length L is not a multiple of the interval la of forming micro-beams as shown in FIG. 12C, operations are carried out as shown in FIGS. 12D to 12F. Micro-beams are sequentially formed with a pattern end set as a starting point as shown in FIG. 12D. If a remaining pattern length 1b is equal to/higher than a predetermined micro-beam interval 1x, micro-beams are directly provided. The setting to the predetermined interval 1x or higher is designed to prevent dense disposition of micro-beams, which is set larger by 10 times than a line width. In FIG. 12E, if a remaining pattern length is larger by twice or lower than 1a, micro-beams are formed at a place divided into two equal parts. This method enables micro-beams to be simply formed without considering an entire pattern length. Alternatively, if L/1a cannot be divided, the number of micro-beams is set by rounding out places after the decimal point, and micro-beams are formed as shown in FIG. 12F. If the number of micro-beams is n in this case, an interval of forming micro-beams is set to L/n. Thus, the minimum necessary number of micro-beams can be formed with good balance, thereby increasing a mechanical strength of a reticle.

(Tenth Embodiment)

Figure 13:
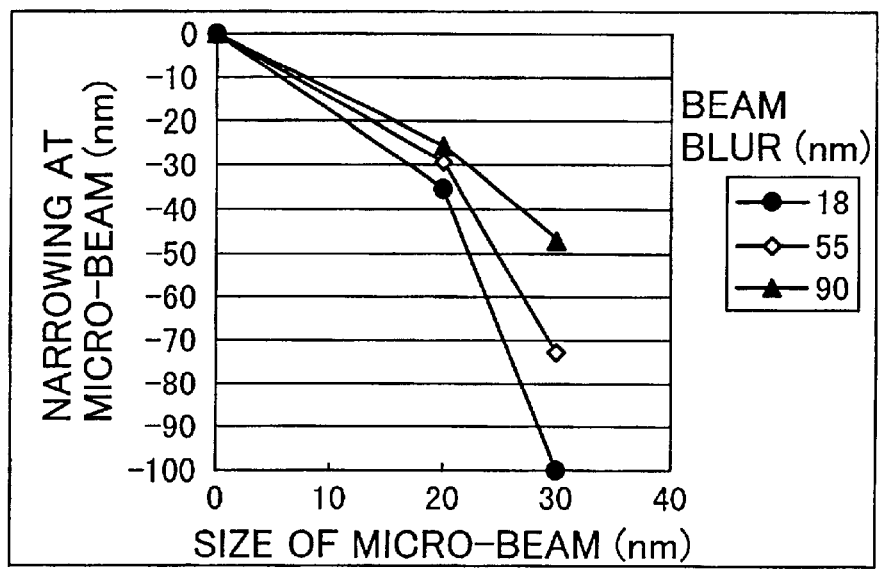
FIG. 13 is a view showing dependence of narrowing of a transcribed pattern on a micro-beam size at a different beam blur in a micro-beam for the reticle for electron beam projection.

The shapes of the micro-beams have been described as measures to prevent bending or middle falling of the reticle for charged electron projection lithography. The present embodiment is described by using simulation of a micro-beam size. FIG. 13 shows dependence of narrowing on a micro-beam size at a micro-beam on an isolated line of 100 nm for each beam blur. In the embodiment, sizes converted on a wafer are used for all pattern sizes unless otherwise specified. As shown in FIG. 13, as beam blur is larger, narrowing at the micro-beam is smaller. Thus, when beam blur is large, a micro-beam size can be changed compared with a small beam blur. For example, to reduce narrowing to 30 nm or lower, a micro-beam size is set equal to/lower than 17 nm at 18 nm of beam blur, and equal to/lower than 22 nm at 90 nm of beam blur. Accordingly, by increasing a micro-beam size as much as possible according to beam blur, it is possible to increase a mechanical strength of the reticle for electron projection lithography. For example, when an opening area of an electron beam projection mask is larger, a current value is increased, and a coulomb effect enlarges beam blur. Thus, a width of a micro-beam in a subfield of a large opening area is set at least equal to/larger than that of a micro-beam in a subfield of a small opening area.

Figure 14:
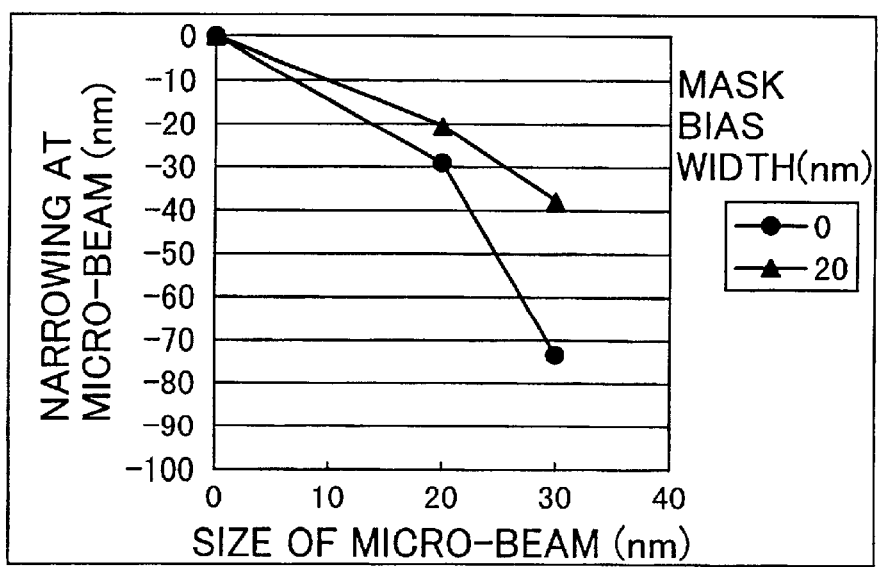
FIG. 14 is a view showing dependence of narrowing of a transcribed pattern on a micro-beam size at a different mask bias width in a micro-beam for the reticle for electron beam projection.

A size of narrowing is substantially constant without any dependence on a pattern size, or a pattern density if beam blur is similar. Accordingly, as shown in FIG. 14, if a micro-beam size is set to be about ¼ or lower of a pattern size, a size of narrowing can be set almost equal to/lower than ¼ of the pattern size. However, if a micro-beam becomes equal to 100 nm or higher, even if the size of narrowing is ¼ of the pattern size, a reduction in a resist film thickness of a transcribed pattern at a micro-beam becomes a problem in the case of a negative resist, and a residue of resist becomes a problem in the case of a positive resist. Thus, a micro-beam size must be set equal to/lower than 100 nm. To obtain a sufficient mechanical strength of a micro-beam, however, a micro-beam size must be set equal to/higher than 10 nm (mask size 40 nm)/.

A size of narrowing can be reduced by simultaneously using mask-bias. For example, FIG. 14 shows dependence of a size of narrowing of an isolated line of 100 nm on a micro-beam size. Here, mask-bias processing is a method of setting a width of a transcribed pattern to a predetermined size by setting an opening width of a mask to be small beforehand, and increasing the amount of irradiation. As shown in FIG. 14, if 20 nm mask-bias is carried out for a formed pattern 100 nm, and pattern projection is carried out with an opening size set to 80 nm, a size of narrowing is reduced to 10 nm at a micro-beam size of 10 nm with respect to one carried out without mask-bias. Accordingly, by simultaneously using micro-beam processing and mask-bias processing, it is possible to suppress narrowing of a pattern by the micro-beam, or increase a suppressing effect by increasing a micro-beam size.

Figure 15:
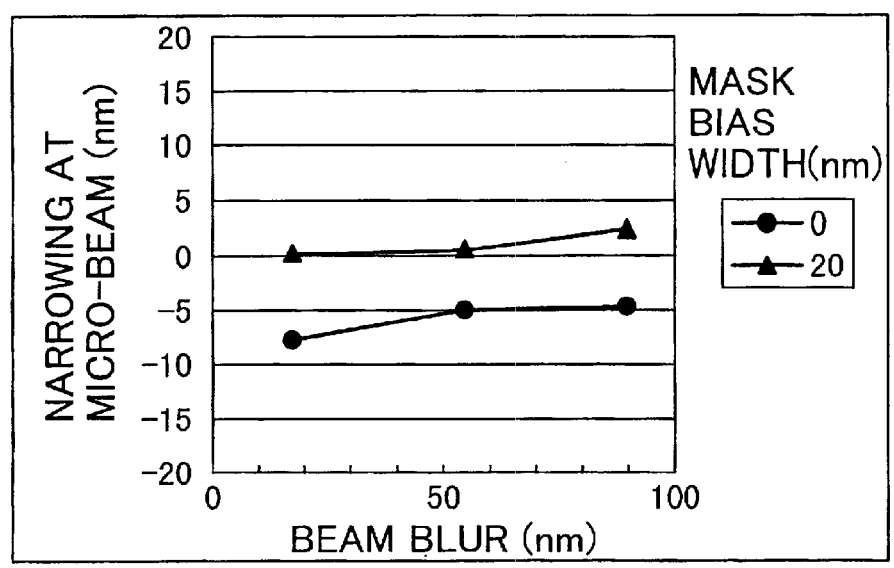
FIG. 15 is a view showing dependence of beam blur of a transcribed pattern size in a projection micro-beam for the reticle for electron beam projection.

FIG. 15 shows a result of a case of using the projection-shaped micro-beam used in FIG. 10E. Here, a micro-beam width is set to 20 nm, an opening pattern size to 70 nm, a size of a projection portion in the horizontal direction of the projection-shaped micro-beam to 20 nm, and a length of a vertical direction to 20 nm. As shown in FIG. 15, a size of narrowing can be set equal to/lower than 10 nm with respect to a design size of 70 nm and, by simultaneously using mask-bias, the size of narrowing can be reduced more. By providing such a projection-shaped micro-beam, it is possible to greatly reduce a narrowing size of a pattern at the micro-beam.

(Eleventh Embodiment)

Figure 16A:
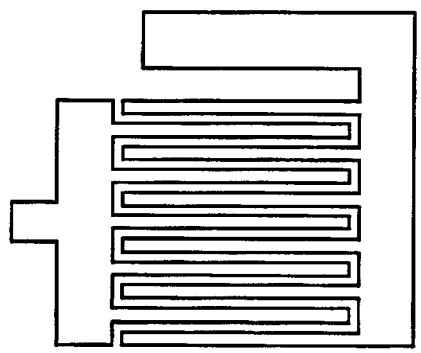
FIGS. 16A to 16D are views, each showing a micro-beam forming flow according to an embodiment of the present invention.
Figure 16B:
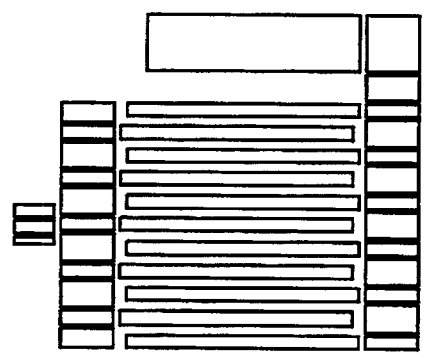
Figure 16C:
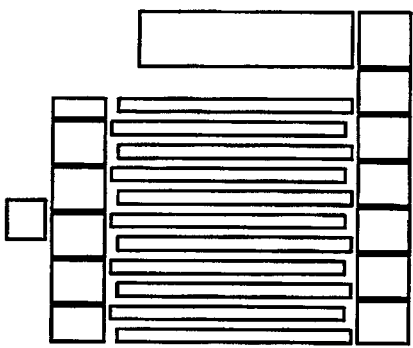
Figure 16D:
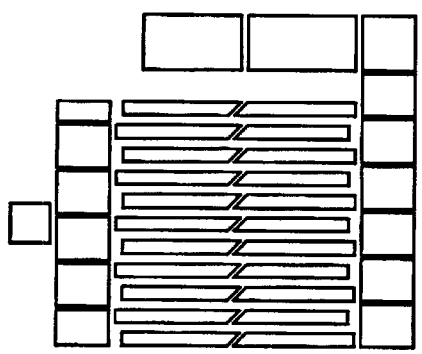

The methods of forming micro-beams into individual shapes have been described with reference to the fourth to ninth embodiments. In the present embodiment, description is made of a method of forming micro-beams for electron projection lithography by using specific patterns with reference to FIGS. 16A to 16D. To manufacture a reticle of a pattern similar to that shown in FIG. 16A, rectangles shown in FIG. 16B are obtained by division into plural rectangles. Then, for a drawing having an interval of micro-beams smaller than a predetermined value 1x, this interval is set lager than the value 1x by making connection with peripheral patterns. Here, pattern synthesis is carried out so as to make a synthesized pattern close to a square in shape, and formation of micro-beams by very small patterns is reduced. For micro-beams of opening patterns having different sizes, a width of a micro-beam formed at an opening pattern of a large size is set to be larger than that of a micro-beam of an opening pattern having a small size. Accordingly, a mechanical strength of the entire reticle can be increased. This is because even if slight bending occurs by the influence of a micro-beam, its effect is small at a large pattern. For remaining long patterns, pattern division is carried out based on the previous embodiments. Here, the diagonal micro-beam used in FIG. 10C of the seventh embodiment is applied. According to the present embodiment, it is possible to form micro-beams even for complex patterns. Even if no bending problems occur at a large pattern itself, the mechanical strength of the entire reticle can be increased by providing a micro-beam at such a place according to the embodiment. Thus, even if there are places where a mechanical strength around a large pattern is low, causing easy bending, it is possible to suppress occurrence of bending.

(Twelfth Embodiment)

Figure 17A:
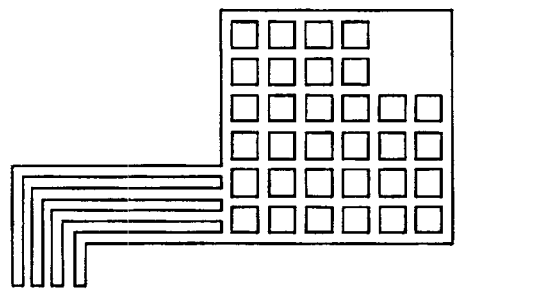
FIGS. 17A to 17E are views, each showing a micro-beam forming flow according to an embodiment of the present invention.
Figure 17B:
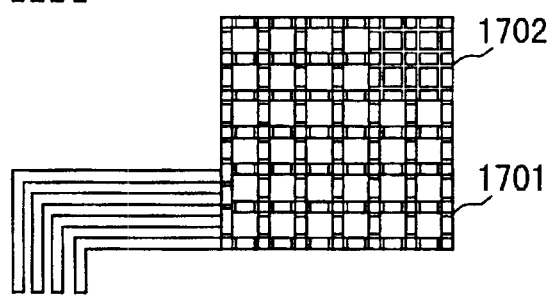
Figure 17C:
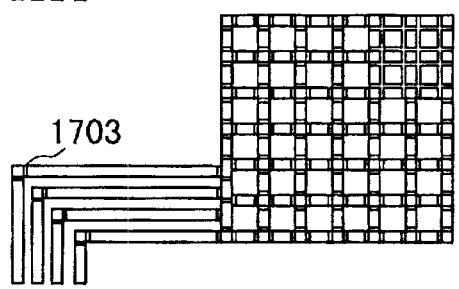
Figure 17D:
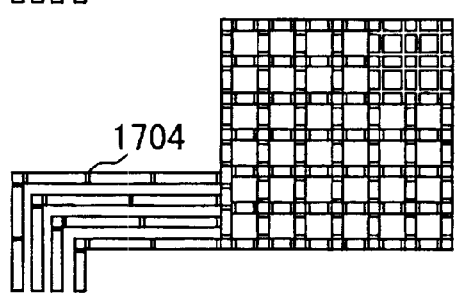
Figure 17E:
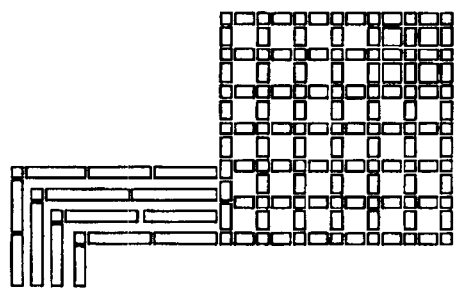

Next, description will be made of another embodiment, to which micro-beams are applied, by referring to FIGS. 17A to 17E. As shown in FIG. 17A, a pattern includes a doughnut type pattern. First, since the doughnut type pattern physically falls if no micro-beams are provided, micro-beams are preferentially formed. Here, the doughnut type pattern can be extracted by using a commercially available computer aided design (CAD) tool. After the extraction, a micro-beam 1701 is formed as in the case of FIG. 9B.

A micro-beam 1702 is formed in the forming process of the micro-beam 1701, not always necessary, and thus may be removed. However, it is preferable to keep the micro-beam 1702 in order to increase a mechanical strength of a reticle. A micro-beam 1703 is formed at a bent portion by division into plural rectangles shown in FIG. 17C and, for remaining long patterns, micro-beams 1704 are formed for each predetermined interval. Accordingly, it is possible to form a micro-beam at a pattern including the doughnut type pattern.

(Thirteenth Embodiment)

FIG. 21 shows an embodiment of applying a micro-beam of the present invention to a complementary reticle. Here, as shown in (a) of FIG. 21, there is an active area 2101, and complementary division is not carried out excluding at a pattern bent portion on this active area. A reason is as follows. At the complementary reticle, two reticles are projected onto the same place to form patterns. However, it is difficult to completely eliminate a positional shift of each pattern projection and, if such a positional shift occurs, a device characteristic is greatly affected.

At the pattern bent portion, since the device characteristic is not greatly affected even if some positional shifting occurs, complementary division is carried out. Since no division is carried out in the active area 2101, long opening patterns are left, consequently reducing a mechanical strength against bending or the like. Thus, for a place having a possibility of bending, a micro-beam having a projection used in FIG. 10E of the seventh embodiment is used to suppress size fluctuation in the active area. First, a pattern of FIG. 21A is divided at a pattern bent portion of FIG. 21B.

Further, a pattern is divided into a reticle A and a reticle B so as to make occurrence of bending difficult. A result is shown in FIG. 21C. In this case, division is carried out to set pattern densities substantially equal to each other. Then, micro-beams are formed at a pattern of a length equal to a micro-beam forming interval la and a bent portion, and a result is shown in FIG. 21D. Subsequently, micro-beams are formed at places other than the bent portion in the active area 2101. In addition, a diagonal micro-beam is provided at the bent portion and, in places other than this, normal micro-beams 2103 having no projections are provided. Thus, by providing the micro-beams at the complementary reticle, mis-alignment of exposed patterns using two complementary reticles is prevented and, by providing the projection-shaped micro-beam, it is possible to form a pattern of high size accuracy. Moreover, even if the complementary reticles are used, by providing the micro-beams at places of insufficient mechanical strength, and places of mis-alignment in complementary reticle division, the number of divided pieces can be reduced, the mechanical strength of the reticle can be increased, and yield of reticle manufacturing can be increased.

(Fourteenth Embodiment)

Figure 22A:
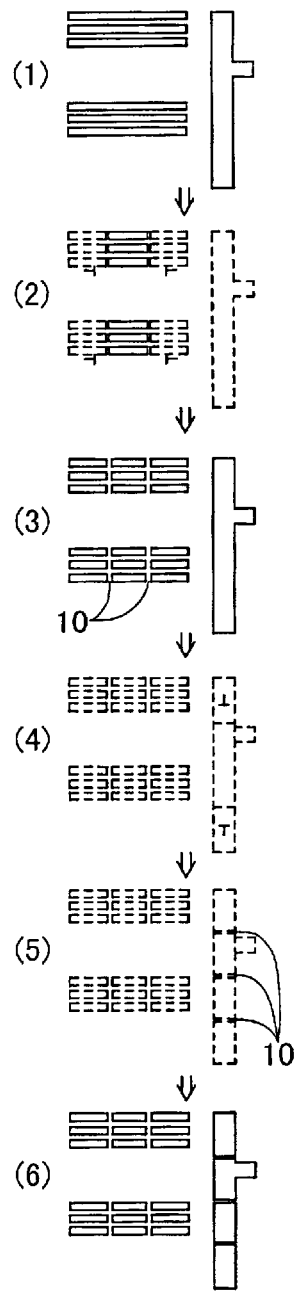
FIGS. 22A and 22B are views, each showing a micro-beam forming flow according to an embodiment of the present invention.
Figure 22B:
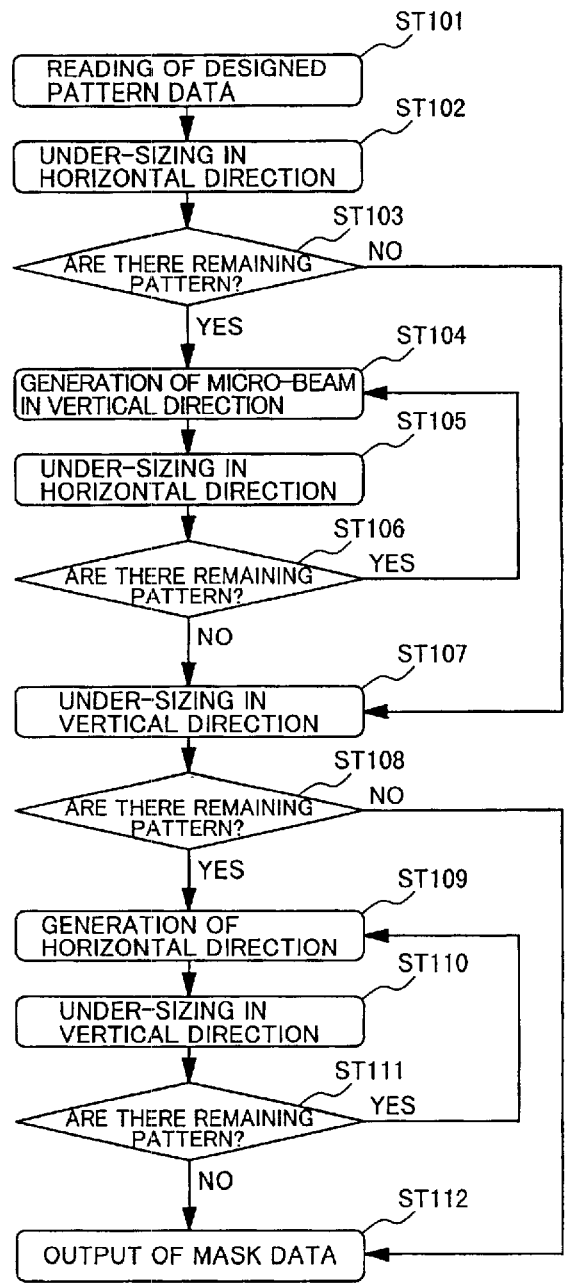

Next, description will be made of a method of forming micro-beams using DA based on process flows of FIGS. 22A and 22B. First, at st 101, layout data of FIG. 22A-1 is read. A minimum size is 0.1 $\mu$m in a chip of the present embodiment. Accordingly, if there is a pattern of 1:1 L&S, a pattern length of a bending start becomes 7.5 $\mu$m from FIG. 6. In this case, a predetermined amount 1b of an interval of forming micro-beams is set to ⅕ of 7.5 $\mu$m. While occurrence of bending can be completely prevented by an interval of ½, a smaller value of ⅕, i.e., 1.5 $\mu$m, is set to provide a margin. Thus, a reticle having less danger of bending is manufactured. A size of a micro-beam is set to a size to be processed, i.e., 15 nm (reticle size 60 nm).

Figure 2B:
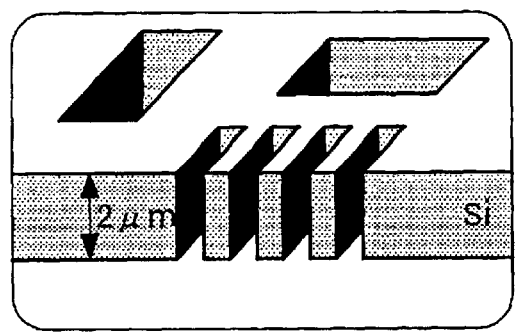
Figure 2C:
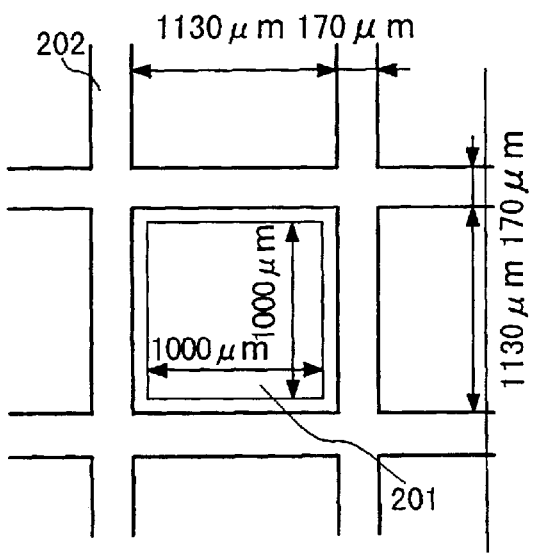
Figure 3A:
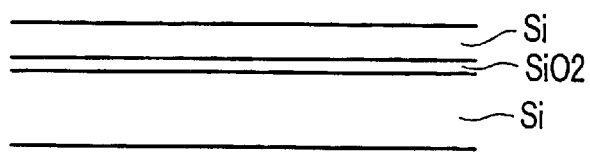
FIGS. 3A to 3D are views, each showing a reticle manufacturing flow in electron beam projection.
Figure 3B:
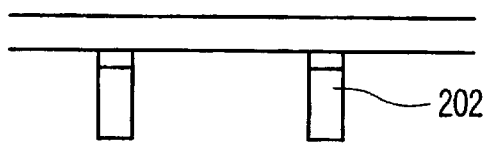
Figure 3C:
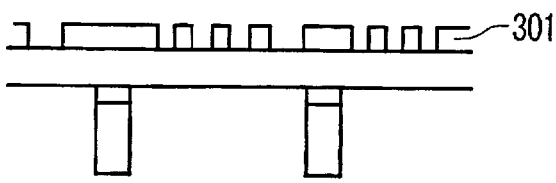
Figure 3D:

In order to form a micro-beam based on the layout data of FIG. 22A-1, for all patterns, a vertical side of the layout data is extracted as shown in FIG. 22A-2, downsizing is made by a predetermined amount in a horizontal direction to reduce patterns, thereby forming a micro-beam 10 on a boundary (st 102). These steps are repeated until image data disappears (st 103 to st 106), thus forming vertical micro-beams. Then, as shown in FIG. 22A-4, downsizing is made in a vertical direction as in the case of the horizontal direction (st 107). By forming micro-beams, micro-beams 10 are formed for predetermined intervals as shown in FIG. 22A-5, and this step is repeated until image data disappears (st 108 to st 111). Through the above-described steps, as shown in FIG. 22A-6, reticle data having micro-beams generated for each predetermined interval can be outputted (st 112).

Thus, it is possible to manufacture a reticle having no bending. In the embodiment, the micro-beams 10 equal in size are formed for all the patterns. However, an interval of forming micro-beams may be changed depending on a pattern size or a distance from an adjacent pattern. Accordingly, the number of micro-beams can be reduced, facilitating reticle manufacturing more.

(Fifteenth Embodiment)

Figure 23A:
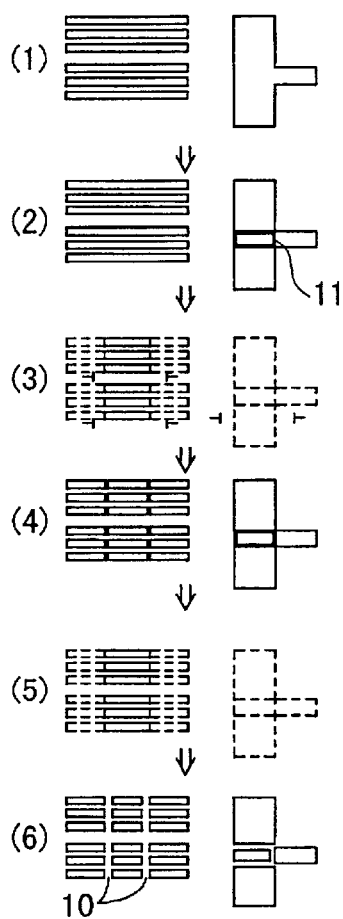
FIGS. 23A and 23B are views, each showing a micro-beam forming flow according to an embodiment of the present invention.
Figure 23B:
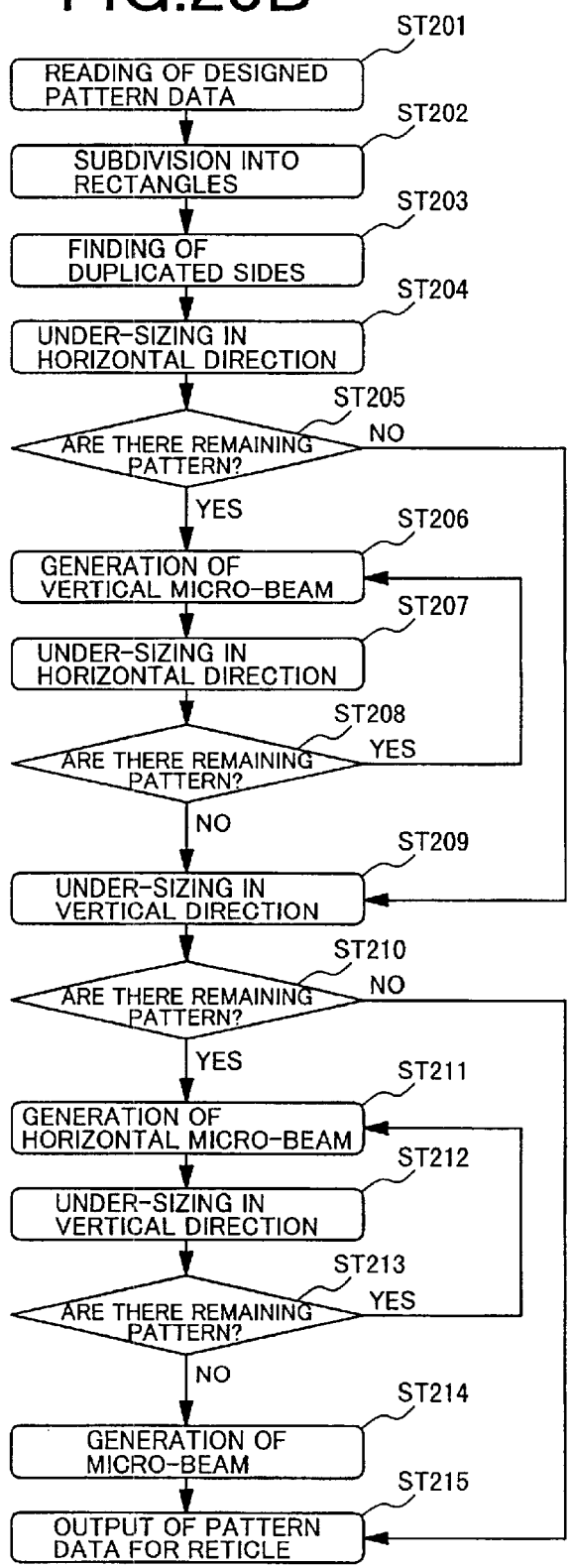

Next, description will be made of a method of forming micro-beams using DA based on process flows of FIGS. 23A and 23B. First, at st 201, layout data of FIG. 23A-1 is read. A minimum size is 0.08 $\mu$m in a chip of the present embodiment, and there are patterns of a minimum pitch ½ L&S. Accordingly, a pattern length of a bending start becomes 9.5 $\mu$m from FIG. 6. Thus, a predetermined amount 1a of an interval of forming micro-beams is set to ⅓ or lower of a change in a designed size, i.e., 3 $\mu$m smaller than such a value. To set pattern narrowing to 30 nm or lower by a micro-beam, a micro-beam size is set to 30 nm (size 120 nm on a reticle). A size range not to be projected (upper limit) is about 200 nm by experience.

In order to form micro-beams based on the layout data of FIG. 23A-1, division into rectangles is carried out as shown in FIG. 23A-2 (st 202), and a boundary 11 is formed at a duplicated side of the rectangles (st 203). Then, as shown in FIG. 23A-3, downsizing is made by a predetermined amount la in a horizontal direction toward the pattern inside of the layout data, thereby forming a boundary 11 as shown in FIG. 23A-4. This step is repeated to form a vertical boundary line, and the step is repeated until pattern data disappears (st 204 to 208). If a pattern is simply 3 μm or lower, e.g., 2 μm, patterns disappear by making pattern downsizing in a horizontal direction. This can be achieved by a DA function. Downsizing is made similarly by a predetermined amount 1*a* in a vertical direction toward the pattern inside of the layout data, thereby providing boundaries from remaining patterns and design data. These steps are repeated (st 209 to st 213). In FIG. 23A-5, all pattern data disappear by the downsizing of 1*a*. By this step, a boundary between the rectangular patterns is extracted, and a micro-beam 10 is formed at the place (st 214). Through the above-described steps, it is possible to manufacture a reticle having no bending.

Moreover, according to the invention, by making division into rectangles, duplication between a pattern edge and the micro-beam is prevented, and a transcribed pattern more faithful to the design data can be obtained.

(Sixteenth Embodiment)

Next, description will be made of a method of forming micro-beams using DA based on FIGS. 24A and 24B. First, as shown in FIG. 24A-1, layout data is read (st 301).

Figure 24A:
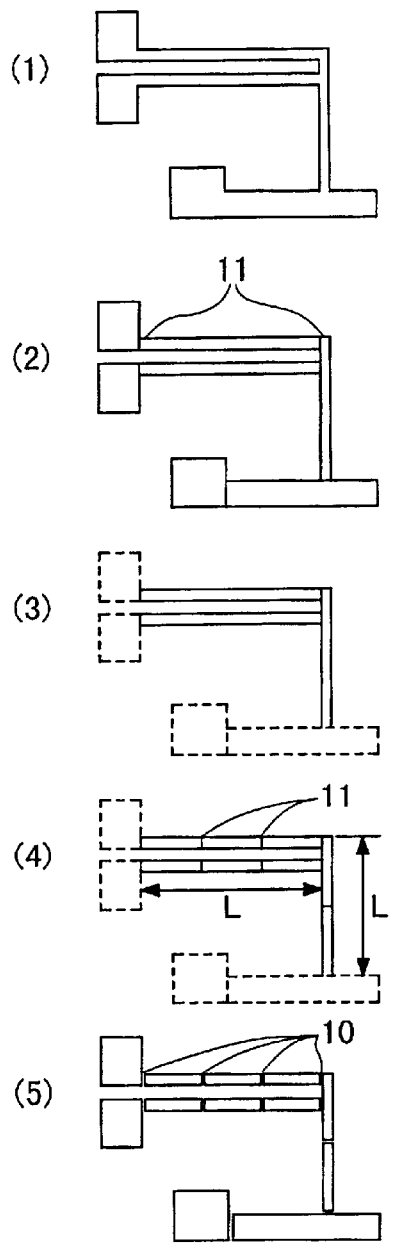
FIGS. 24A and 24B are views, each showing a micro-beam forming flow according to an embodiment of the present invention.
Figure 24B:
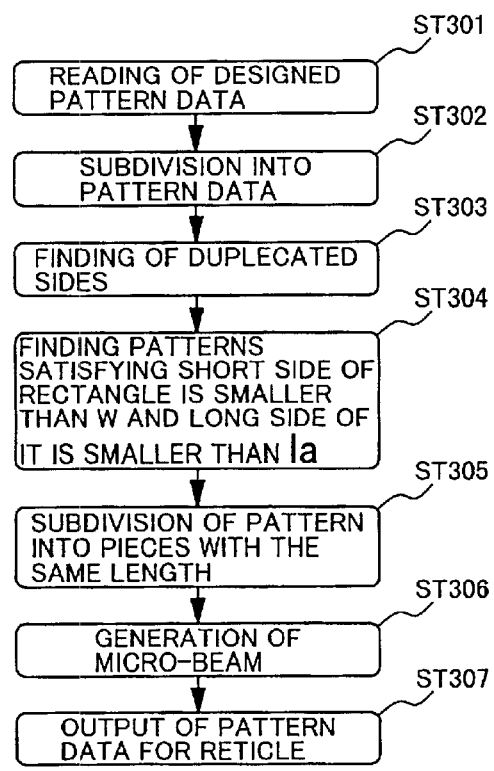

To form a micro-beam based on the layout data shown in FIG. 24A-1, subdivision into pattern data is carried out as shown in FIG. 24A-2 (st 302), and duplicated sides of rectangles are extracted, forming a boundary 11 (st 303). Then, a pattern having a short size W of 200 nm or lower, and a longitudinal size 1*a* of 3 μm (FIG. 24A-3, and st 304). Then, as in the case of FIG. 12F, if a pattern longitudinal size is L, assuming that L/1*a* can be divided, division into rectangles is carried out at the number thereof, and at the number obtained by rounding up a place after the decimal point if not divided, and a divided portion is set as a boundary 11 (FIG. 24A-4, and st 305). A micro-beam 10 is formed at the formed boundary portion (st 306), and the layout data is outputted (st 307). Accordingly, it is possible to effectively form micro-beams, and suppress dense setting of micro-beam intervals.

(Seventeenth Embodiment)

Figure 26A:
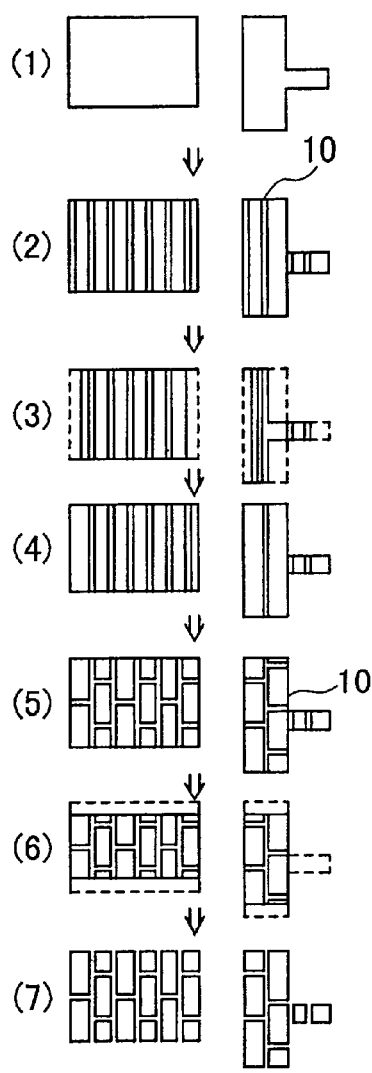
FIGS. 26A and 26B are views, each showing a micro-beam forming flow according to an embodiment of the present invention.
Figure 26B:
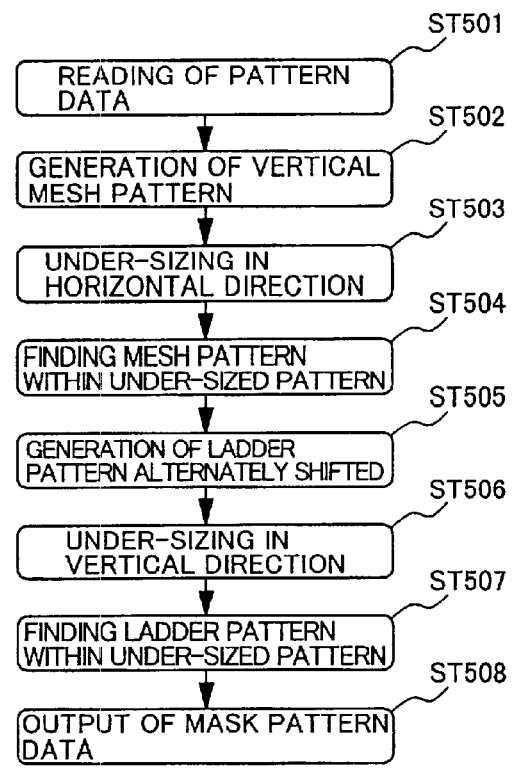

Next, description will be made of a method of forming micro-beams using DA according to another embodiment based on process flows of FIGS. 26A and 26B. The present embodiment is described with reference to a method of first providing meshed micro-beams, and then removing micro-beams around a pattern boundary or the like. As shown in FIG. 26A, layout data shown in FIG. 26A-1 is read (st 501), and then vertical mesh pattern is formed. An interval of mesh patterns is 1 μm. Observation by an optical microscope finds that at about 3 μm or lower, even a micro-beam of 20 nm can be formed without any bending. The micro-beam is set away by at least 0.3 μm from a pattern edge of a direction parallel to the micro-beam. This is because if the micro-beam and the pattern edge are close to each other in parallel, an influence by the micro-beam on the pattern edge is increased. Especially, at 0.1 μm or lower, the influence becomes considerably large, starting a change in a pattern size greater than a predetermined size.

As shown in FIG. 26A-2, vertical micro-beams are formed at an interval 1 μm of mesh patterns (st 502). Then, as shown in FIG. 26A-3, downsizing is made by 0.3 μm in a horizontal direction toward the inside of pattern data (st 503). A duplicated portion with micro-beam mesh drawing data is left, and an unduplicated micro-beam mesh is removed, thereby obtaining a pattern having a micro-beam mesh as shown in FIG. 26A-4 (st 504). Then, micro-beams are formed in a horizontal direction. In the embodiment, Amida shape of a ladder is formed, where horizontal lines connecting parallel vertical lines are alternately arranged with respect to the vertical lines. First, micro-beams are installed vertically upward at each 1 μm with a left lower end of pattern data as a reference. After a side of the left end is finished, then micro-beams of a horizontal direction are installed at a 1 μm pitch from a place away from the lower end by 0.5 μm in an area surrounded with a vertical micro-beam next in the left. By repeating these steps, a pattern shown in FIG. 26A-5 is obtained (st 505). Then, downsizing is made by 0.2 μm in a vertical direction (st 506), duplicated micro-beams of the horizontal direction are extracted (st 507), and then the micro-beams of the vertical and horizontal directions are synthesized (st 508). Thus, a micro-beam having a mesh shown in FIG. 26A-7 can be formed.

In the embodiment, an interval of micro-beams is set to 1 μm. On design data, a sufficient mechanical strength is obtained by setting an interval of micro-beams to 2 μm. However, in the embodiment, since the micro-beams duplicated with the pattern periphery are removed, there is a possibility that the interval of micro-beams may spread to about 2 μm, twice larger than 1 μm. Thus, the interval is set shorter than that obtained from the pattern data, thereby suppressing occurrence of bending.

(Eighteenth Embodiment)

Figure 27A:
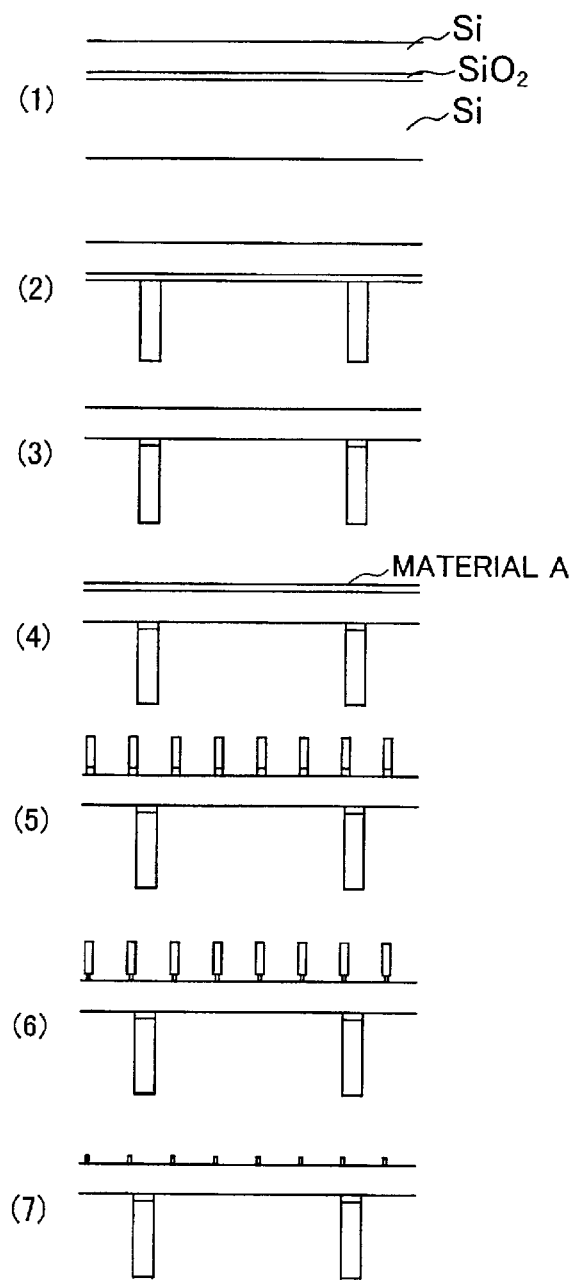
FIGS. 27A and 27B are views, each showing a micro-beam forming flow according to an embodiment of the present invention.

The methods of forming micro-beams using DA have been described with reference to the fourteenth to seventeenth embodiments. In the present embodiment, description is made of a method of forming micro-beams in reticle manufacturing based on process flows of FIGS. 27A and 27B. A pattern to be subjected to electron beam projection has a size of ¼ thereof. First, dry etching is carried out for back-side Si of an Si substrate containing Si (thickness 1 μm)/$SiO_2$ (thickness 0.1 μm)/Si (thickness 750 μm) to manufacture a membrane reticle having a strut left as shown in FIG. 27A-2 (st 601). Then, by carrying out an etching step, an oxide film is removed as shown in FIG. 27A-3 (st 602). Then, as shown in FIG. 27A-4, $Si_3N_4$ is deposited by 50 nm as a material A on the surface by a chemical vapor deposition step (st 603).

Subsequently, pattern projection is carried out into a predetermined micro-beam shape. In micro-beam projection in this case, a reticle for photolithography, having a mesh pattern of at least one subfield is prepared beforehand, and pattern projection is carried out to form a resist pattern (st 604). Then, etching is carried out by using the resist as a mask (st 605), and a micro-beam having a membrane mesh shape is formed (st 606). The micro-beam on the mesh will be described in detail later with reference to a twentieth embodiment. Here, it has a mesh shape shown in FIG. 29. A pattern shape in this case is a mesh of Amida shape, a pitch of micro-beams is 2 μm, and a micro-beam size is 0.3 μm. In this case, since formation is not based on a reticle pattern shape, an interval of micro-beams is set small, i.e., 2 μm, so as to prevent formation of a doughnut type pattern in the mesh. No micro-beam patterns are formed at strut portions except a part. Its purpose is as follows. If micro-beams are formed on a reticle full surface, stress is applied in the membrane by a stress difference with silicon and, when a reticle pattern is formed, reticle breaking must be prevented. According to the embodiment, because of a structure where micro-beams are provided on the full surface in the subfield, stress in the subfield can be made uniform. Thus, it is possible to prevent a positional shift in projection caused by stress generated by a difference between sparse and dense dispositions of patterns after the formation of reticle patterns, or reticle undulation during stage movement of the reticle.

Figure 27B:
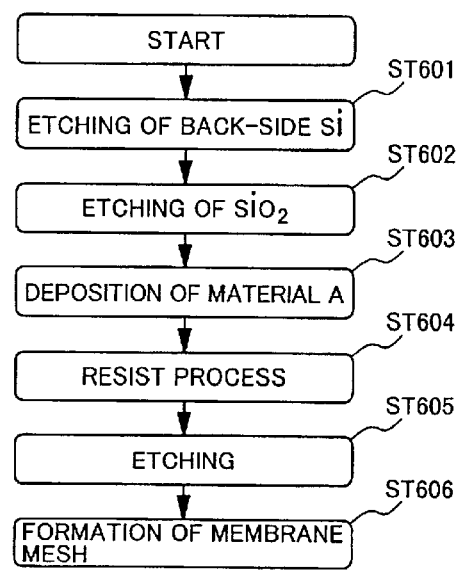

Then, by carrying out isotropic etching, a micro-beam size is narrowed to 70 nm, and the resist is removed. A result is shown in FIG. 27B-7. Through such steps, it is possible to form a micro-beam extremely small in size and high in mechanical strength. A micro-beam is defined to a thickness for not giving any influence in pattern projection, and thus a small size error is not a problem. Preferably, however, a pattern width is set small considering size controllability.

$Si_3N_4$ is used for the material A in this case. However, any materials can be used as long as they are different from single crystal Si. More preferably, for the material A, a material having smaller scattering of electron beams than Si is used, such as diamond-like carbon. This is because use of the material having little scattering of electron beams makes micro-beam projection difficult. In addition, in the embodiment, the photolithography is used for pattern projection of the micro-beams for the reticle for electron projection lithography. However, electron beam direct wiring may be used. In the case of using the photolithography for pattern projection of micro-beams, manufacturing throughput is high.

On the other hand, in the case of using the electron projection lithography, because of high resolution, the micro-beam shown in FIG. 27A-5 can be narrowed thin beforehand in resist pattern projection. For example, a pattern width is about 300 nm in the case of the photolithography. However, a pattern width can be set to 100 nm in the case of the electron projection lithography. Accordingly, since the amount of isotropic etching shown in FIG. 27A-6 can be reduced to 30 nm, micro-beam processing accuracy can be increased. In the embodiment, the micro-beams are formed after the strut formation. Thus, by forming the micro-beams after the strut formation, it is possible to carry out strong cleaning after the strut formation, and reduce possibility of mask defects caused by foreign objects.

Conversely, strut formation may be carried out after micro-beams are formed. In this case, by attaching the material A having larger membrane stress onto the thin membrane, it is possible to prevent breaking of the membrane. The isotropic etching for narrowing the micro-beams may be carried out after the formation of the reticle pattern. Accordingly, the number of steps after the formation of narrow micro-beams is reduced, making it possible to prevent breaking of the micro-beams.

(Nineteenth Embodiment)

Figure 28A:
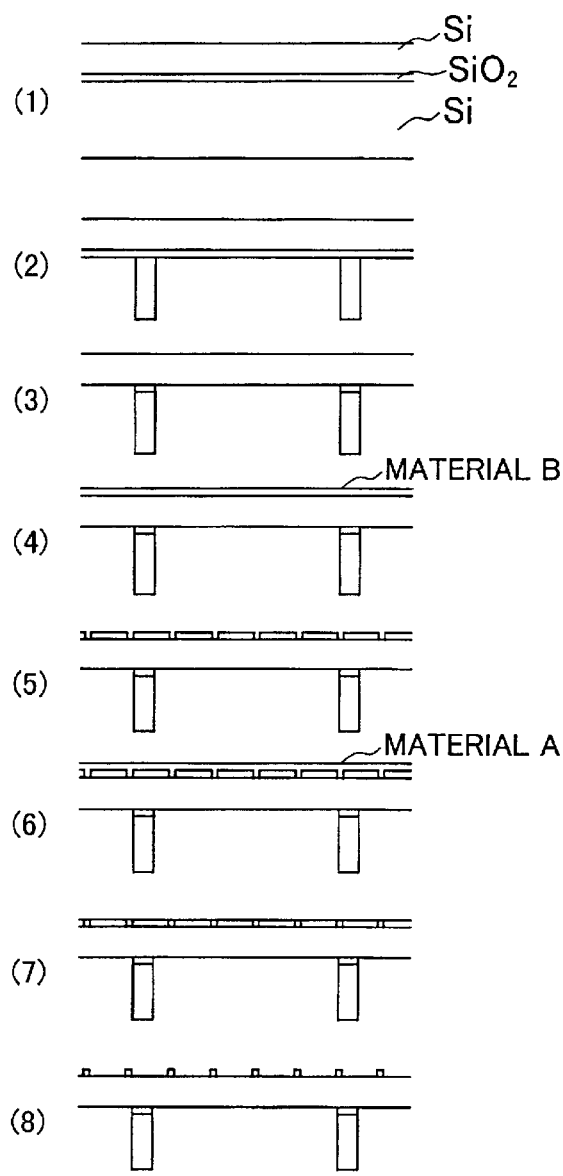
FIGS. 28A and 28B are views, each showing a micro-beam forming flow according to an embodiment of the present invention.
Figure 28B:
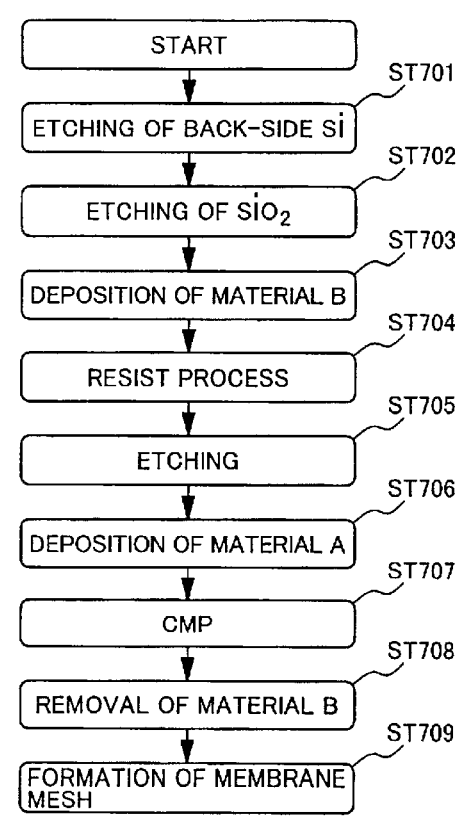

In the present embodiment, description is made of another method of forming micro-beams in reticle manufacturing based on process flows of FIGS. 28A and 28B. A pattern to be subjected to electron beam projection is ¼ thereof. First, dry etching is carried out for back-side Si of an SOI substrate containing Si (thickness 2 μm)/SiO$_2$ (thickness 0.2 μm)/Si (thickness 750 μm) to form membrane reticle blanks having struts left as shown in FIG. 28A-2 (st 701). Hereinafter, as in the case of the eighteenth embodiment, an oxide film is removed by etching (FIG. 28A-3, and st 702), $Si_3N_4$ is deposited by 100 nm as a material B by chemical vapor deposition (FIG. 28A-4, and st 703), and pattern projection is carried out into a predetermined micro-beam shape (FIG. 28A-5, and st 704).

Further, etching is carried out (FIG. 28A-5, and st 705). Then, as a material A, titanium is deposited by chemical vapor deposition (FIG. 28A-6, and st 706), and then the titanium on $Si_3N_4$ is removed by chemical mechanical polishing (FIG. 28A-7, and st 707). Further, by etching, $Si_3N_4$ on Si is removed (FIG. 28A-8, and st 708). Through such steps, a micro-beam very small in size and high in mechanical strength can be formed (FIG. 28A-8, and st 610). The titanium is used for the material A in this case. However, any materials can be used as long as they are different from single crystal Si. According to the embodiment, the material B is prepared by the chemical mechanical polishing after the pattern formation of the material A. Thus, etching is not necessary for the material B. Therefore, it is possible to increase material options for the material B.

(Twentieth Embodiment)

Figure 29:
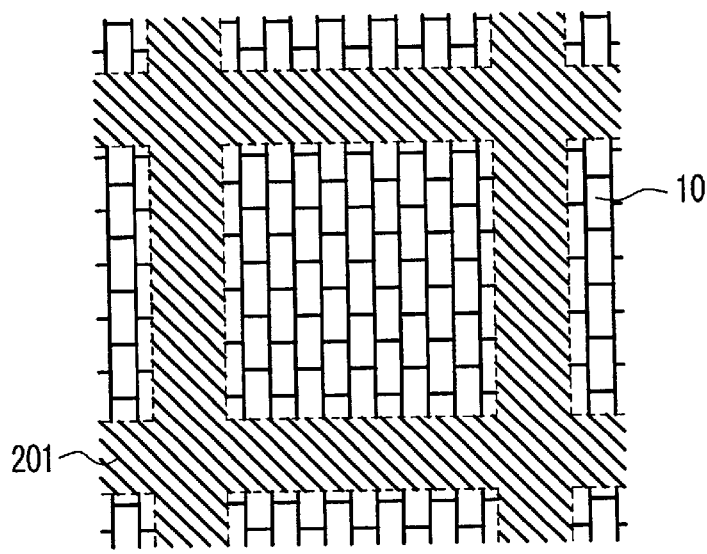
FIG. 29 is a view showing a micro-beam forming place according to an embodiment of the present invention.

In the present embodiment, description is made of a mesh shape by referring to FIG. 29. FIG. 29 shows disposition of micro-beams on a stencil reticle. In this case, micro-beams of Amida shapes are used, where horizontal lines connecting parallel vertical lines are alternately arranged with respect to the same to form a ladder shape. A strut size is 0.17 mm, and a micro-beam size is 100 nm (both are sizes on a mask). As shown, by connecting a strut having a high mechanical strength with a micro-beam 10, a subfield in the strut can also have a high strength. The micro-beam 10 is not disposed on the full surface of the strut. For the micro-beam here, a material different from Si of a membrane portion is used. Accordingly, strong membrane stress is generated if a micro-beams is left on the full surface of the strut, and a positional shift occurs in a transcribed pattern because of following distortion. Thus, by removing the micro-beam on the strut, occurrence of large distortion can be prevented.

This micro-beam on the mesh is easily manufactured by using a photolithography device, and preparing a reticle for mesh formation beforehand. Thus, time for reticle manufacturing can be shortened. If a pattern boundary portion and the micro-beam are duplicated, size shifting may occur. In such a case, pattern writing is carried out without any reticles as in the case of electron beam direct writing, and the micro-beams is changed by a reticle pattern. Alternatively, micro-beam removal/increase is carried out. Further, a point of intersection between the micro-beams can be changed. Thus, by changing the micro-beam in accordance with pattern data, even if micro-beam projection is difficult or the micro-beam is projected, an influence on a device characteristic is reduced.

Figure 30A:
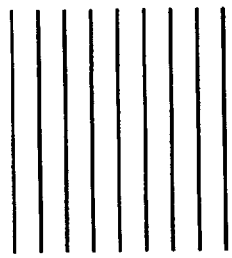
FIGS. 30A to 30F are views, each showing a shape of meshed micro-beam according to an embodiment of the present invention.
Figure 30B:
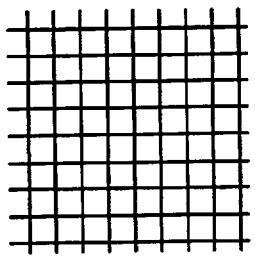
Figure 30C:
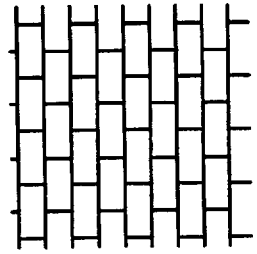
Figure 30D:
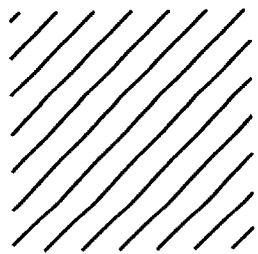
Figure 30E:
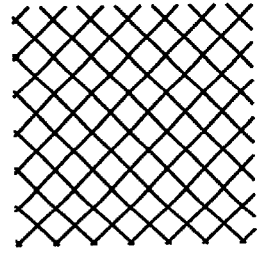
Figure 30F:
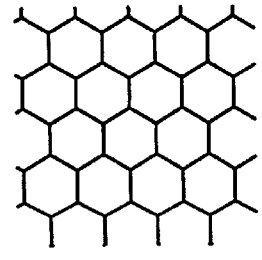

Now, a shape of a micro-beam mesh is described by referring to FIGS. 30A to 30F. If a pattern direction is horizontal, a vertical mesh shown in FIG. 30A is used. If vertical and horizontal patterns are mixed, a simple mesh shown in FIG. 30B is used. In the case of the simple mesh, four points of intersection of micro-beams are present. Consequently, pattern shape deterioration may become a problem at the four points of intersection. In such a case, by using an Amida mesh, where horizontal lines connecting parallel vertical lines are alternately arranged with respect to the same to form a ladder shape, the number of points of intersection is reduced to three, thereby reducing an influence on micro-beam pattern projection. In FIG. 30D, a diagonal micro-beam is used. An element such as a semiconductor is basically composed of vertical and horizontal patterns. Accordingly, since the diagonal micro-beam enables a micro-beam parallel to a pattern to be eliminated, it is possible to suppress an influence of micro-beam projection on a pattern. Especially, at an angle of 45° or −45°, the vertical and horizontal lines are well balanced. If a mechanical strength is low with only the diagonal micro-beam, a micro-beam strength can be increased by using the simple mesh or the Amida shape shown in FIG. 30E. As another example of the simple mesh, a hexagonal shape shown in FIG. 30F may be used.

(Twenty First Embodiment)

Figure 18A:
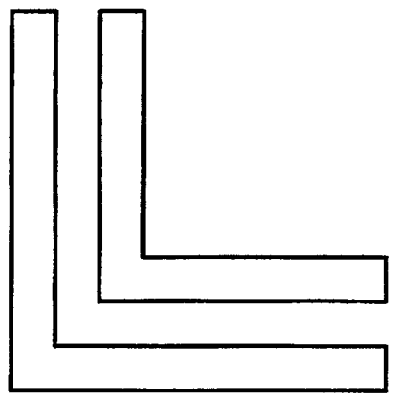
FIGS. 18A to 18D are views, each showing a projection method on a reticle having a micro-beam according to an embodiment of the present invention.
Figure 18B:
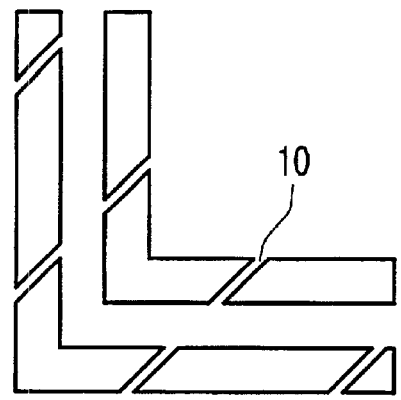

In the present embodiment, description is made of a method of preventing micro-beam projection by carrying out shift exposure using the same reticle with reference to FIGS. 18A to 18D. If a pattern shown in FIG. 18A is present, a diagonal micro-beam shown in FIG. 18B is formed. Micro-beams are formed in the same direction at least in the same subfield, and these are diagonal micro-beams of 45° in the embodiment. A micro-beam size is set to 20 nm on a wafer. Here, the direction of the micro-beam is set to 45°, because a semiconductor device is most often composed of vertical and horizontal rectangular patterns.

Figure 18C:
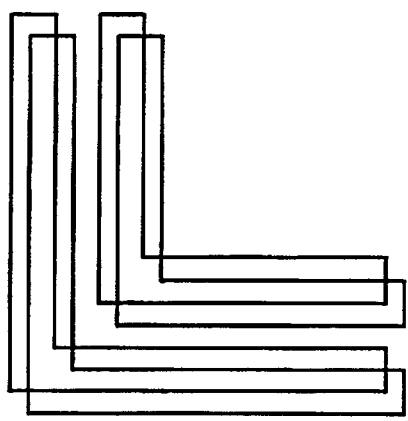
Figure 18D:
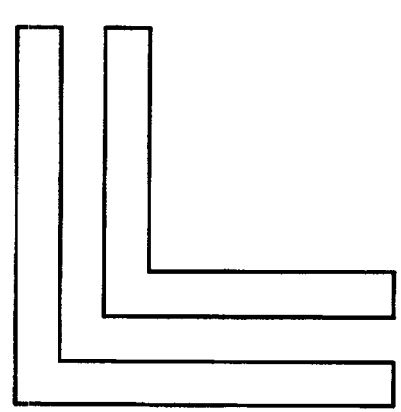

Further, after one pattern projection, reticle pattern projection is carried out again on a position shifted by 20 nm in a direction orthogonal to the direction of the micro-beam by beam deflection (FIG. 18C). The amount of irradiation for one operation is ½ of that when irradiation is carried out only once). In these two rounds of exposure, a center coordinate is held. Accordingly, by carrying out such shift exposure, micro-beam projection can be prevented (FIG. 18D). Further duplicated exposure is effective for improving connection of each subfield. In the embodiment, the direction of the micro-beam is 45°, but a direction is not limited to this. For example, as directions of micro-beams, the micro-beams may be mixed in vertical and horizontal directions. In this case, however, shift exposure is carried out in a direction of largest elongation with respect to the micro-beams of two directions, +45° or −45° direction here. Moreover, a pattern formed in this case is set to a size considering exposure carried out twice. Thus, the influence of a micro-beam on narrowing can be reduced.

Figure 19:
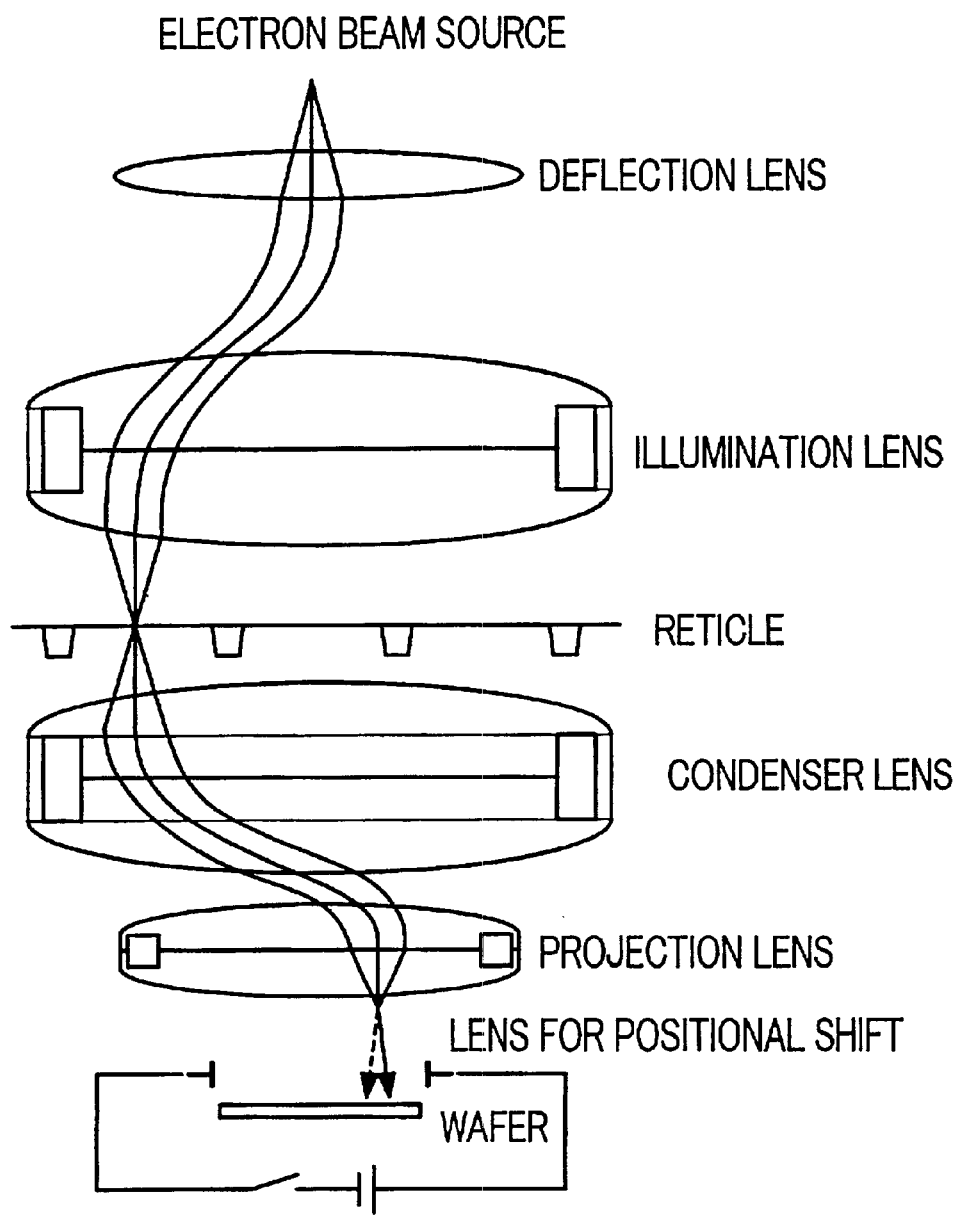
FIG. 19 is a view showing electron beam lithography according to an embodiment of the present invention.
Figure 20A:
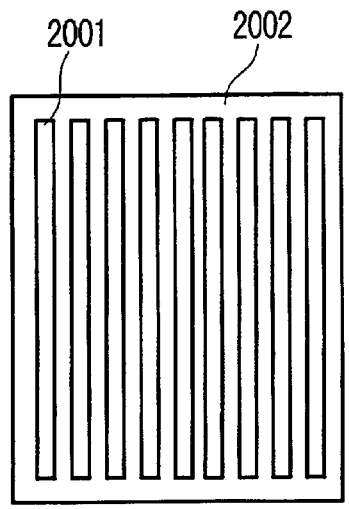
FIGS. 20A and 20B are views, each showing a problem in a conventional reticle for electron beam projection.
Figure 20B:
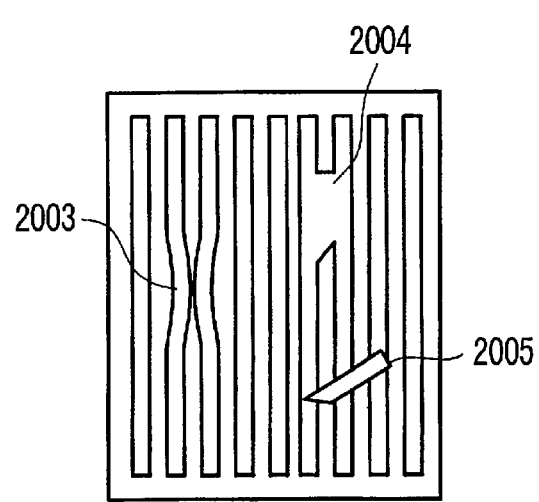
Figure 25:
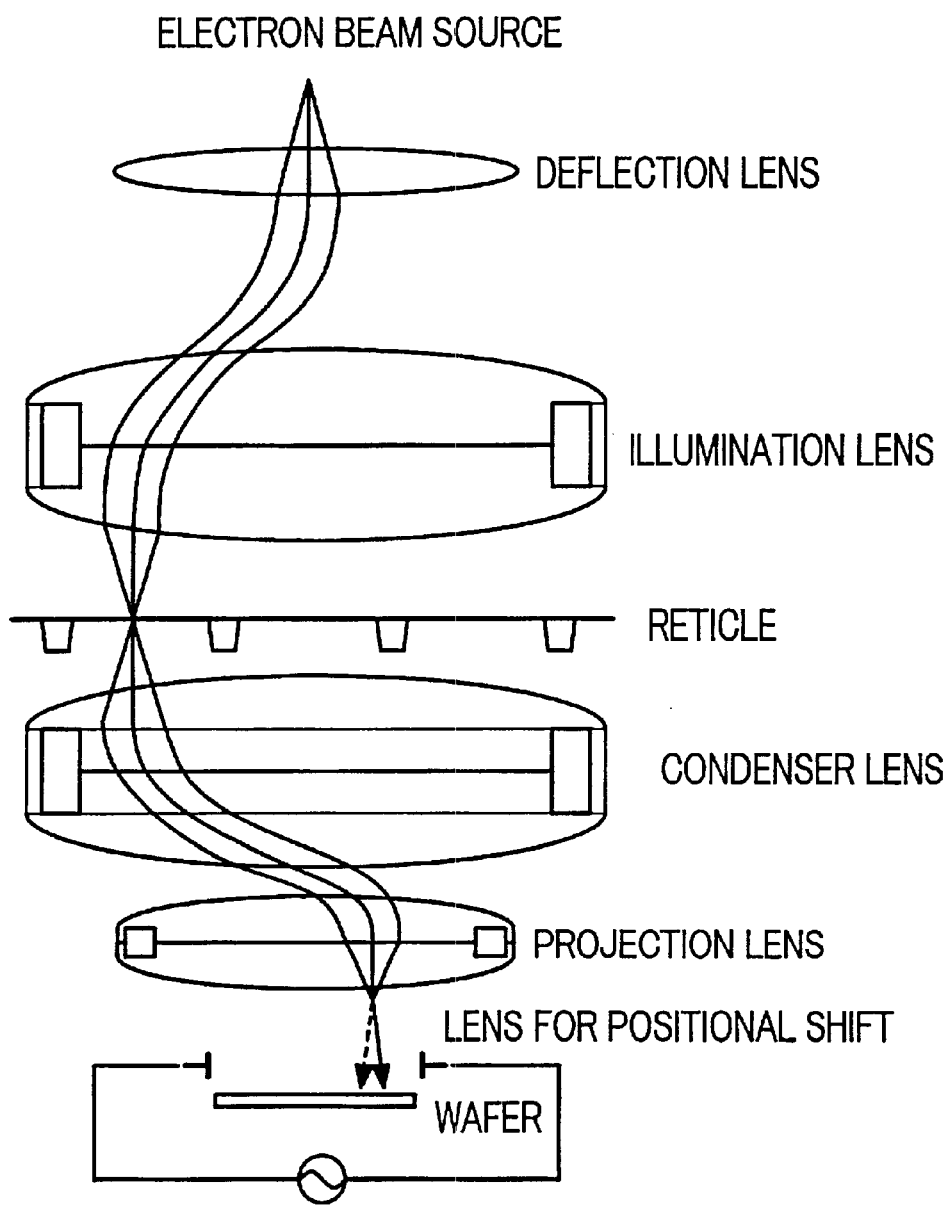
FIG. 25 is a view showing electron projection lithography according to an embodiment of the present invention.

In the embodiment, the shift exposure is carried out by beam deflection. Other than this, the reticle can be moved for shifting. Alternatively, as shown in FIG. 19, shifting can be achieved by providing a lens for positional shift to cause deflection. For the shifting lens, two lens parameters are prepared and, by switching these lens parameters, shift exposure can be easily carried out. Alternatively, by making connection to an alternator as shown in FIG. 25, a projection position may be undulated by the lens for positional shift, and pattern projection may be carried out in synchronization therewith. For example, if a current value on the reticle is 25 $\mu$A, resist sensitivity is 6 $\mu$C/cm$^2$, and a subfield is 250 $\mu$m$^\square$, time for one shot becomes 150 $\mu$sec., and a frequency of the alternator may be simply 3.3 kHz. However, this value varies depending on device design. By setting a frequency high (e.g., 100 kHz), throughput can be improved.

The foregoing is a shift in a projection position in one direction. However, a position of irradiation may be moved circularly around one point. This circular motion enables the influence of micro-beams to be reduced irrespective of the direction of the micro-beams. If beam blur is 30 nm in this case, circular motion of a radius 10 nm is made to generate beam blur of about 20 nm. Accordingly, by considering beam blur equivalent to 36 nm from $(30^2+20^2)^{1/2}$ as total beam blur, and changing design data, a transcribed pattern may be formed into a desired shape.

The foregoing shift exposure may generate beam blur, making it difficult to form micro patterns. On a layer needing formation of micro patterns such as gate patterns, directions of forming micro patterns are set to be identical, and the shift exposure is carried out in the same direction as that for the micro patterns. Thus, for the micro patterns, it is possible to eliminate the influence of beam blur by the shift exposure.

(Twenty Second Embodiment)

Figure 31:
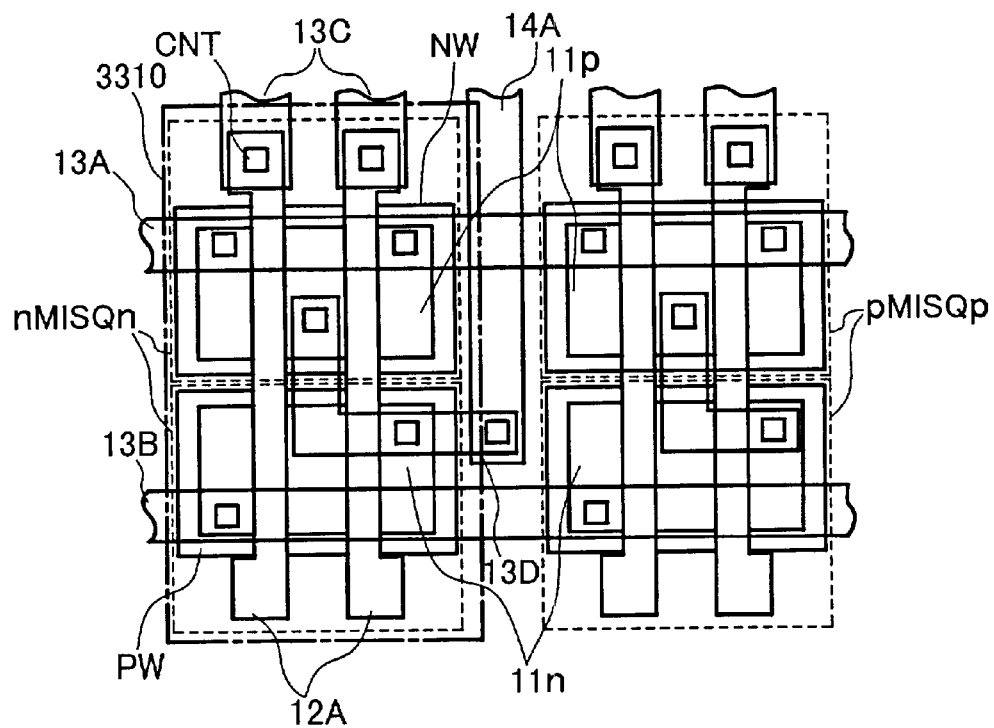
FIG. 31 is a main-portion plan view showing an example of a semiconductor integrated circuit device according to an embodiment of the present invention.

Next, description will be made of a specific example of manufacturing a semiconductor integrated circuit. Here, description is made of a case of applying the present invention to a manufacturing method of, for example a semiconductor integrated circuit device manufactured by a semi-custom system such as a gate array or a standard cell, alternatively a semiconductor integrated circuit device including a custom input/output (I/O), a custom logical circuit or an interface (I/F) circuit on a semiconductor substrate. FIG. 31 is a plan view showing a part of a logical element in a semiconductor integrated circuit device.

The logical element is composed of a unit cell 3310 surrounded with a chain line shown in FIG. 31. This unit cell 3310 includes, for example two nMISQn and two pMISQp. The nMISQn is formed on an n-type semiconductor area (diffusion layer) 11$n$ on a surface of a p-well area PW. The pMISQp is formed on a p-type semiconductor area (diffusion area) 11$p$ on a surface of an n-well area NW. A gate electrode 12A is shared by the nMISQn and the pMISQp. The gate electrode 12A has a polycide structure including a silicide layer formed on, for example a unit film of low-resistance polycrystal silicon or a low-resistance polycrystal silicon film, a polymetal structure made by depositing a metal film such as tungsten on a low-resistance polycrystal silicon film through a barrier film containing titanium nitride or the like, or Damascene gate structure formed by depositing a barrier film containing tungsten nitride or the like in a trench bored in an insulator film, and burying a metal film containing copper or the like thereon. A semiconductor substrate portion below the gate electrode 12A becomes a channel area.

A wiring 13A is a power supply wiring of, for example a high potential (e.g., about 3.3 V or 1.8 V), and electrically connected through contact holes CNT to the p-type semiconductor areas 11$p$ of the two nMISQp. A wiring 13B is a power supply wiring of, for example a low potential (e.g., about 0 V) side, and electrically connected through the contact hole CNT to the n-type semiconductor area 11$n$ of one nMISQn. A wiring 13C is an input wiring of a two-input NAND gate circuit, and brought into contact with a wide part of the gate electrode 12A through the contact hole CNT and electrically connected with the same. A wiring 13D is electrically connected through the contact holes CNT to both of the n-type and p-type semiconductor areas 11$n$ and 11$p$. A wiring 14A is electrically connected through the contact hole CNT to the wiring 13D.

Figure 32:
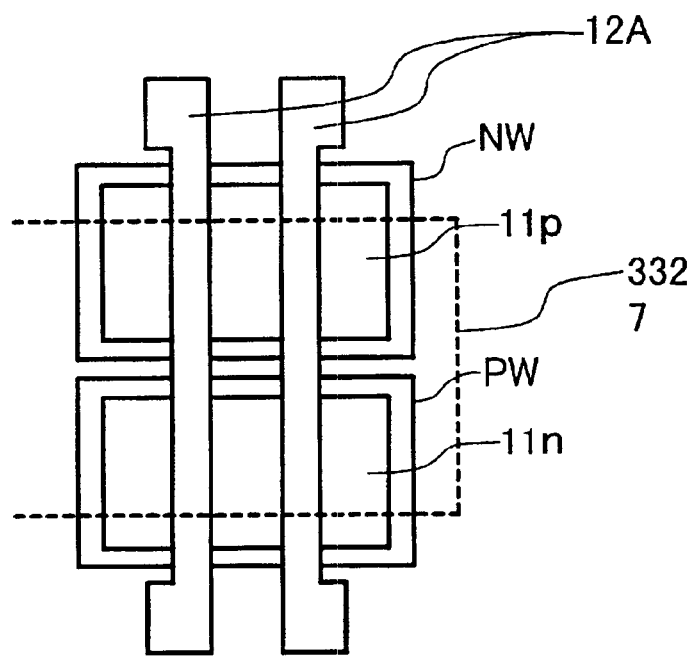
FIG. 32 is a main-portion plan view showing a unit cell of FIG. 31.

FIG. 32 is a plan view showing the unit cell 3310 before the wirings 13A to 13D and 14A are formed. The unit cell 3310 is a basic constituting unit used in common for composing a logical element such as a NAND gate circuit or a NOR gate circuit. By properly selecting wirings after the unit cell 3310, the logical circuit can be efficiently formed. The present invention can be expanded for connection of many complementary MIS (CMIS) circuits.

Figure 33A:
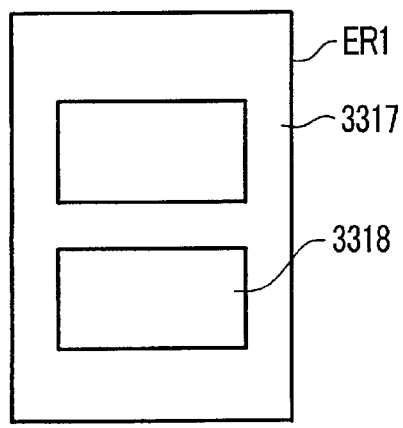
FIGS. 33A to 33D are main-portion plan views showing various reticles used in manufacturing of the semiconductor integrated circuit device of FIG. 31.
Figure 33B:
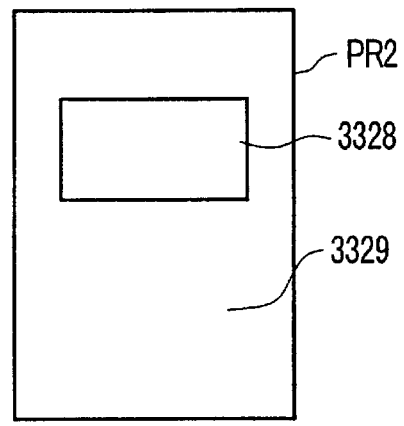
Figure 33C:
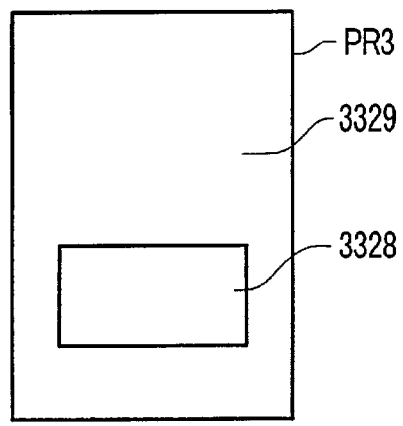

Hereinafter, description is made of a process up to manufacturing of the unit cell 3310 as a basic constituting unit. FIGS. 33A to 33D are expanded views, each showing a reticle for forming an area of the unit cell 3310. In FIG. 33A, an isolation layer is formed. Here, pattern projection is carried out by using electron projection lithography. A reticle ER1 for electron projection lithography shown in FIG. 33A is used when an isolation area in the unit cell 3310 and an active area are formed on a wafer (semiconductor substrate). On a main surface of the reticle substrate for electron projection lithography, for example, two opening areas 3318 formed rectangular on a plane are disposed in parallel, away from each other by a predetermined distance, in a non-opening area 3317. In this case, electron beam negative resist is used. PR2 of FIG. 33B is a reticle for photolithography, used when the n-well area NW is formed in the unit cell 3310 by using the photolithography. An opaque layer 3329 is formed on a main surface of the reticle substrate and, on a part thereof, for example, a clear pattern 3328 rectangular on a plane is opened. The opaque layer 3329 contains metal such as chrome, and is designed to shield an area other than the n-well area on the wafer from a light. PR3 of FIG. 33C is a reticle used when the n-well area PW is formed in the unit cell 3310 by using the photolithography. An opaque layer 3329 is formed on a main surface of the reticle substrate and, on a part thereof, for example, a clear pattern rectangular on a plane is opened. In this case, the opaque layer 3329 is formed to shield an area other than the p-well area on the wafer from a light.

Figure 33D:
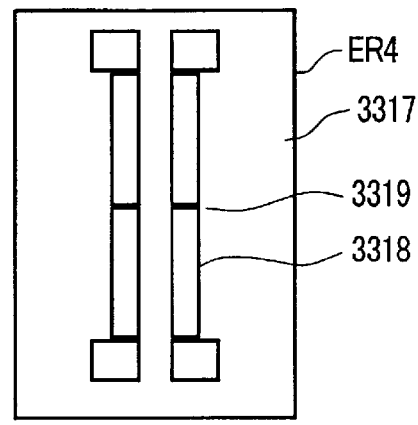

In FIGS. 33B and 33C, a positive resist for photolithography is used. While a type of resist and a resist processing condition vary, steps themselves are similar to those for the electron projection lithography. ER4 of FIG. 33D is a reticle for electron projection lithography, and used when the gate electrode 12A is formed in the unit cell 3310. On a main surface of the reticle substrate, for example two belt-like opening patterns each having wide parts in both ends are formed in parallel with each other. Since a pattern length of the opening pattern is long, a micro-beam 3319 is provided to prevent bending. For this micro-beam, after a pattern is divided into rectangles, no micro-beams are provided on duplicated portions of the active area and the gate pattern. In addition, an electron beam negative resist is used here. Next, description is made of a process up to the formations of the nMISQn and the pMISQp by using sectional views along a broken line 3327 of FIG. 32 with reference to FIGS. 34A to 34E and 35A to 35E. In this case, a positive resist is used in light exposure, while a negative resist is used in electron beam exposure. In the case of photolithography, a negative resist is used for a special occasion (alternate phase shift method or the like), but normally a positive resist is used. This is because the positive resist is higher in resolution and sensitivity. On the other hand, in the case of electron beam direct writing, both positive and negative resists are selectively used in order to reduce the number of shots. In the case of electron projection lithography, both negative and positive resists may be used as there is no dependence on patterns and no changes are made in the number of shots. However, because of an influence by a coulomb effect, preferably, a resist having a smaller pattern writing rate is used as in the case of the direct writing. Further, as the writing rate is changed depending on layers, preferably, a type of resist is changed. For example, in the case of a line type (wiring layer, gate level or the like), a negative type is preferred. In the case of a hole type (contact hole layer), a positive resist is preferred.

Figure 34A:
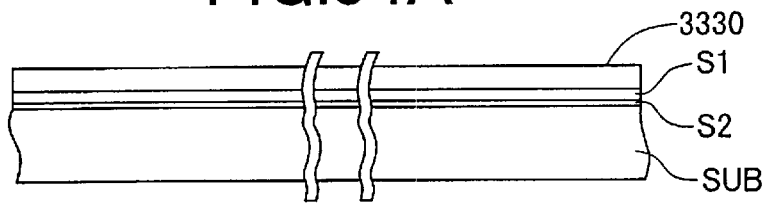
FIGS. 34A to 34E are main-portion sectional views in a manufacturing process of the semiconductor integrated circuit device of FIG. 32.
Figure 34B:
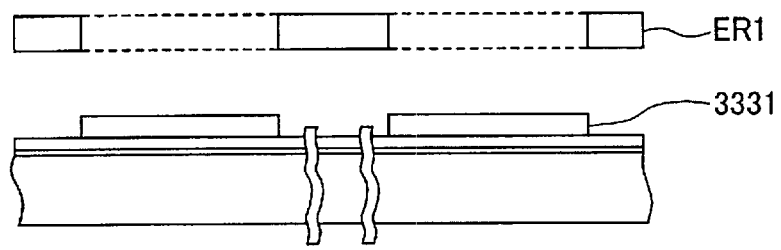
Figure 34C:
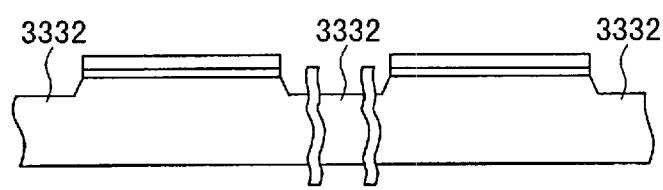

First, for example, an insulator film S2 made of a silicon oxide film is formed by oxidation on a main surface (device surface) of a semiconductor substrate SUB constituting a wafer made of a p-type silicon single crystal. Then, an insulator film S1 made of a nitride silicon film is deposited by chemical vapor deposition (CVD) or the like thereon, and a resist film 3330 is coated thereon (FIG. 34A). Subsequently, projection is carried out for the semiconductor substrate SUB by using the normal reticle ER1, and then development or the like is carried out to form a resist pattern 3331 on the main surface of the semiconductor substrate SUB (FIG. 34B). The resist pattern 3331 is formed on a plane so as to expose an isolation area and cover the active area. Then, with the resist pattern set as an etching mask, the insulator layers S1 and S2 exposed therefrom are sequentially removed, and the main surface portion of the semi-conductor substrate SUB is also removed to form a trench 3332 on the main surface of the semiconductor substrate SUB. Then, the resist pattern 3331 is removed (FIG. 34C).

Figure 34D:
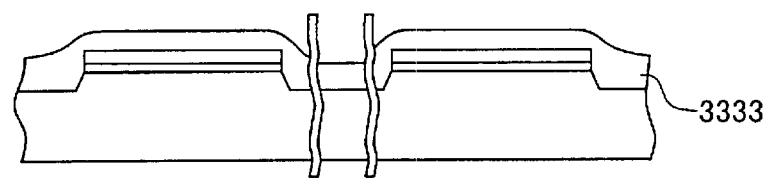
Figure 34E:
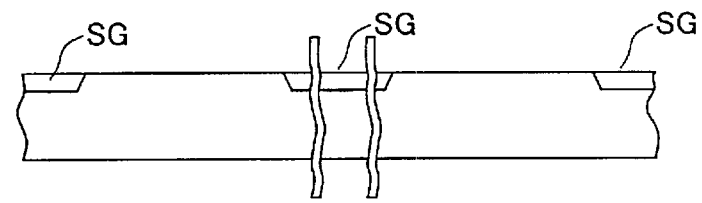

Then, on the main surface of the semiconductor substrate SUB, for example an insulator layer 3333 containing silicon oxide is deposited by CVD or the like (FIG. 34D). Then, by subjecting the semiconductor substrate SUB to planarization by, for example chemical mechanical polishing (CMP) or the like, an isolation area SG of, for example a trench shape is formed lastly (FIG. 34E). In the embodiment, the isolation area is formed in a trench isolation structure. However, it is not limited to this, and for example a subfield insulator layer may be used for formation by local oxidation of silicon (LOCOS) or the like.

Figure 35A:
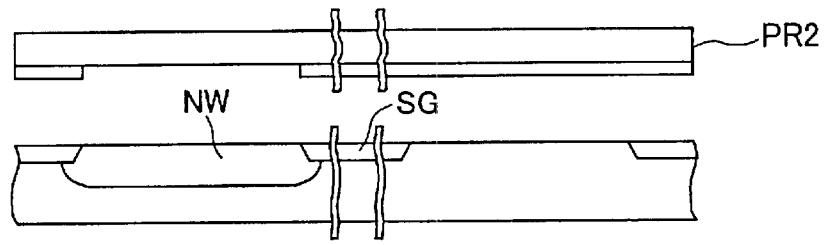
FIGS. 35A to 35E are main-portion sectional views in the manufacturing process of the semiconductor integrated circuit device of FIG. 32 subsequent to FIGS. 34A to 34E.

Subsequently, pattern projection is carried out by similarly using a reticle PR2 for photolithography. A pattern of the reticle PR2 in this case is formed on a plane such that an n-well area NW is exposed, and the other area is covered with an opaque layer containing chrome or the like. Then, ions such as phosphorus or arsenic are implanted to the semiconductor substrate SUB by using the formed resist as a mask, thereby forming an n-well area NW, and then the resist pattern is removed. A result is shown in FIG. 35A.

Figure 35B:
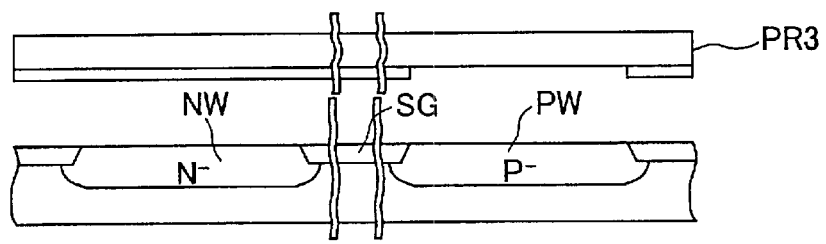

Also, exposure is carried out by similarly using a reticle PR3 for photolithography, and a resist pattern is formed so as to expose a p-well area PW, and cover the other area. Then, by using the resist pattern as an ion implantation mask, ions such as born are implanted to the semiconductor substrate SUB, thereby forming a p-well area PW. Then, a resist pattern 17c is removed (FIG. 35B).

Figure 35C:
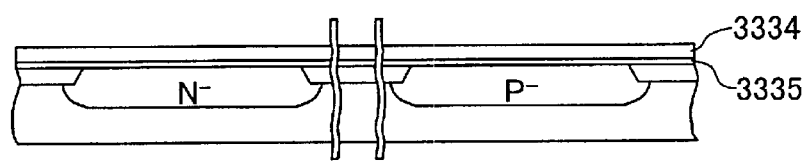
Figure 35D:
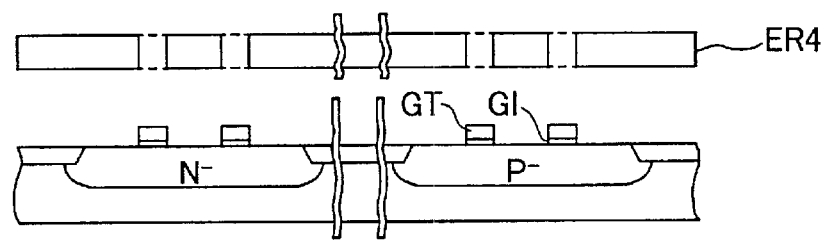
Figure 35E:
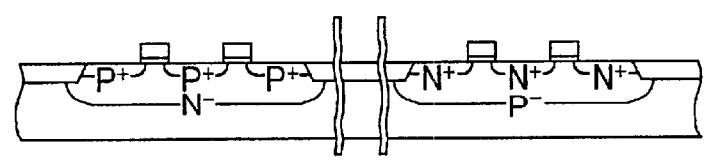

Then, on the main surface of the semiconductor substrate SUB, for example a gate insulator layer 3334 made of a silicon oxide film is formed to, for example a thickness (film thickness in silicon dioxide) of 3 nm by thermal oxidation or the like. Then, a conducting layer 3334 containing polycrystal silicon or the like is deposited thereon by CVD or the like (FIG. 35C). Subsequently, electron projection lithography is carried out by using a reticle PR4 for electron projection lithography, thereby forming a resist pattern. By subsequent etching, a gate electrode GT and a gate oxide film GI are formed (FIG. 35D). Then, an n-type semiconductor area N+ of high impurity concentration for the nMISQn, and a p-type semiconductor area P+ of high impurity concentration for the pMISQp functioning as a source, a drain area and wirings are formed in self-alignment with the gate electrode GT by ion implantation or diffusion (FIG. 35E).

Figure 36A:
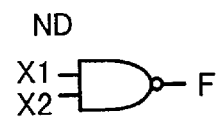
FIG. 36A is a symbol view of a NAND gate circuit constituting the semiconductor integrated circuit device of FIG. 31.
Figure 36B:
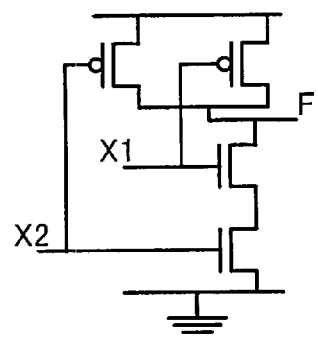
FIG. 36B is a circuit diagram of FIG. 35A.
Figure 36C:
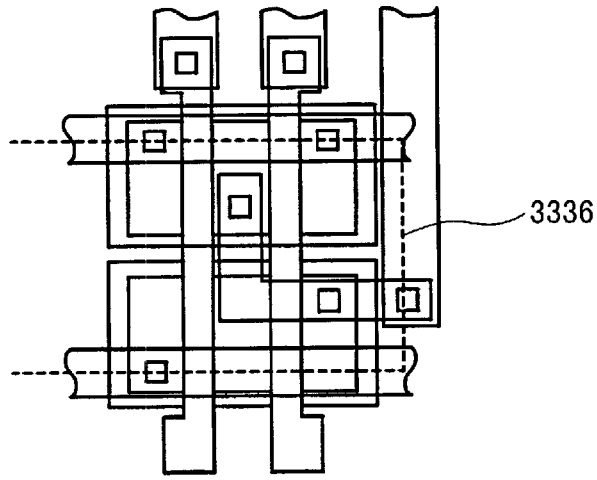
FIG. 36C is a plan view showing a pattern layout of FIG. 36A.

In steps thereafter, by properly selecting wirings, a NAND gate circuit, and a NOR gate circuit can be formed. In the embodiment, a NAND gate circuit ND, for example shown in FIGS. 36A to 36C, is formed. FIG. 36A is a symbol view of the NAND gate circuit ND, FIG. 36B its circuit diagram, and FIG. 36C its layout plan view. The NAND gate circuit ND shown here has two inputs X1 and X2, and one output F.

Next, description is made of a process flow of projecting a contact hole and a wiring pattern of the NAND gate circuit.

Figure 37:
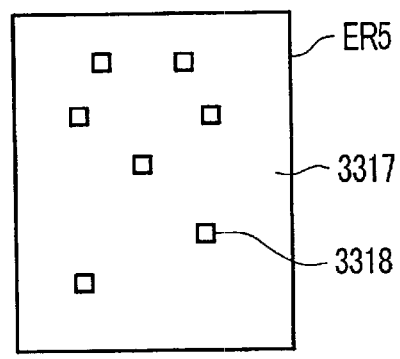
FIG. 37 is a main-portion plan view showing an example of a reticle for electron beam projection, used when a hole pattern is projected at the NAND gate circuit of each of FIGS. 36A to 36C.
Figure 38A:
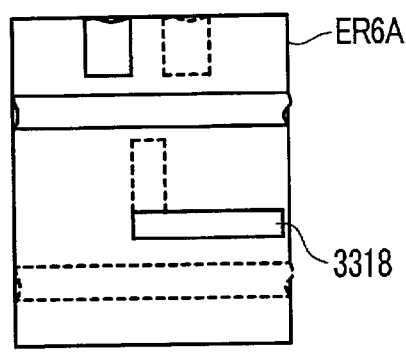
FIGS. 38A and 38B are main-portion plan views each showing an example of a reticle for electron beam projection, used when a line pattern is projected at the NAND gate circuit of each of FIGS. 36A to 36C.
Figure 38B:
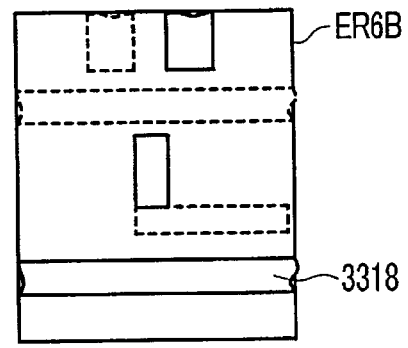

FIG. 37 shows a pattern of a reticle ER5 for electron projection lithography used to project a contact hole CNT of FIG. 31 on a wafer. An opening pattern 3318 in a non-opening pattern 3317 becomes a pattern for forming the contact hole CNT. In this case, an electron beam positive resist is used. ER6A of FIG. 38A and ER6B of FIG. 38B are patterns of complementary reticles for electron projection lithography. By projecting these two reticles on the same place on the substrate, wiring layers 13A to 13D of FIG. 31 are formed.

Next, description is made of a manufacturing process of a semiconductor integrated circuit device using the above-described reticles ER5 ER6A and ER6B by referring to FIGS. 39A to 39F. FIGS. 39A to 39F are sectional views along the broken line 3336 of FIG. 36C.

Figure 39A:
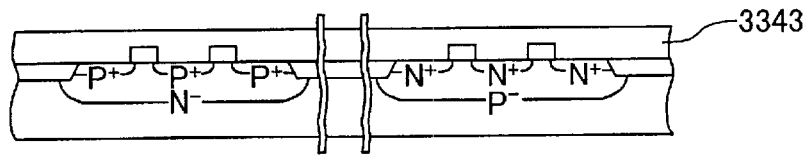
FIGS. 39A to 39F are main-portion sectional views in the manufacturing process of the semiconductor integrated circuit device for forming the NAND gate circuit of each of FIGS. 36A to 36C.
Figure 39B:
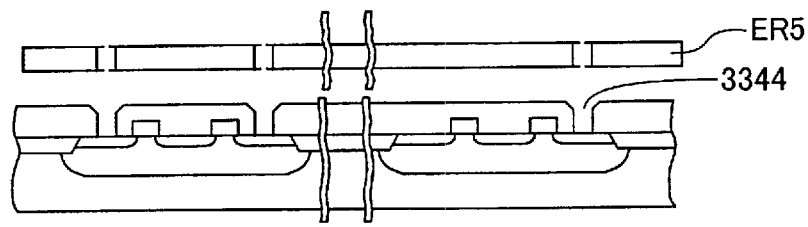

First, nMISQn and pMISQp are formed on the main surface of the semiconductor substrate as described above. Then, on the main surface, for example an interlayer insulator layer 3343 made of a silicon oxide film doped with phosphorus is deposited by CVD or the like (FIG. 39A). Subsequently, an electron beam positive resist is coated on the interlayer insulator layer 3343, and then this is subjected to electron projection lithography using the reticle ER5. Accordingly, a resist pattern is formed so as to expose a forming area of a contact hole, and cover the other areas. Then, by using the resist pattern as an etching mask, a contact hole CNT is formed on the interlayer insulator layer, and the resist is removed (FIG. 39B).

Figure 39C:
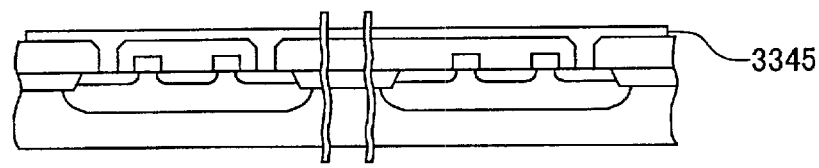
Figure 39D:
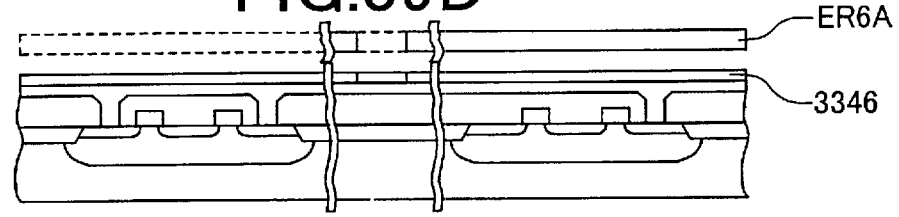
Figure 39E:
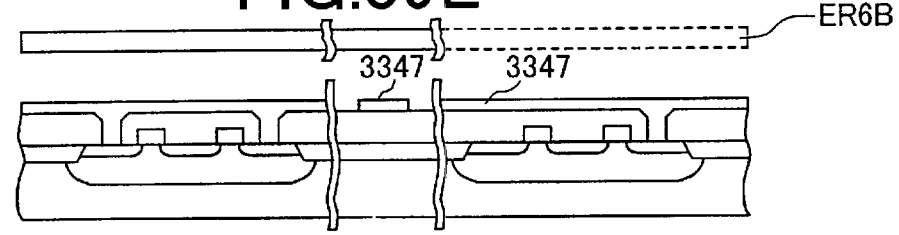
Figure 39F:
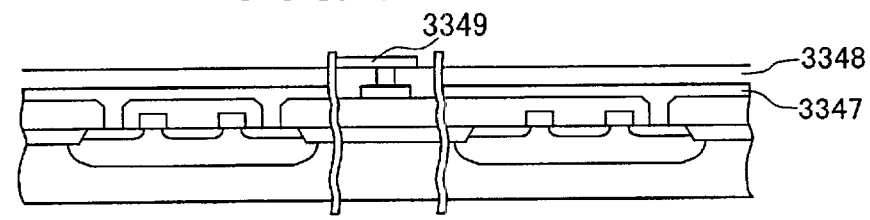

Then, on the main surface of the semiconductor substrate SUB, for example a conducting layer 3345 containing aluminum, an aluminum alloy or copper is deposited by sputtering or the like, and planarization is carried out by chemical mechanical polishing (CMP) or the like (FIG. 39C). Subsequently, an electron beam negative resist layer 3346 is coated on the conductor layer 3345, and subjected to electron projection lithography using the reticles ER6A and ER6B. Accordingly, a resist pattern is formed so as to cover a wiring forming area, and expose the other areas. Then, by etching the conducting layer 3345, a wiring layer is formed (FIGS. 39D and 39E). Thereafter, an interlayer insulator layer 3348 is deposited on the main surface of the semiconductor substrate SUB by CVD or the like and, further, by using other reticles, a through-hole and an upper wiring layer 3349 are formed (FIG. 39F). Connection between components is also carried out by pattern formation based on necessary repetition of steps similar to the above, and thus a semiconductor integrated circuit device is manufactured.

The manufacturing example of the two input NAND gate circuit has been described. By changing the projection system based on the pattern layer as in the present embodiment, it is possible to carry out pattern formation with high size accuracy and high throughput.

The foregoing causes all use electron beams as charged particles. In principle, however, these can be replaced by charged particles containing electron beams/ion beams. In the case of ion beams, resist sensitivity can be increased and, because of little scattering in the resist, a pattern having high resolution can be obtained. On the other hand, in the case of electron beams, even if these are made incident on a non-opening area of the reticle and scattered, damage to the reticle is very small because of light weight. Accordingly, a life of the reticle can be prolonged.

The manufacturing method of the semiconductor has been described. However, a method is not limited to the foregoing. For example, any similar methods can be used, such as a liquid crystal display, as long as pattern projection is carried out on a sensitive substrate by irradiation with energy beams.

(Twenty Third Embodiment)

Manufacturing is carried out for a 1:4 transcribed reticle of a system LSI pattern of a chip size 1 mm angle.

Figure 40:
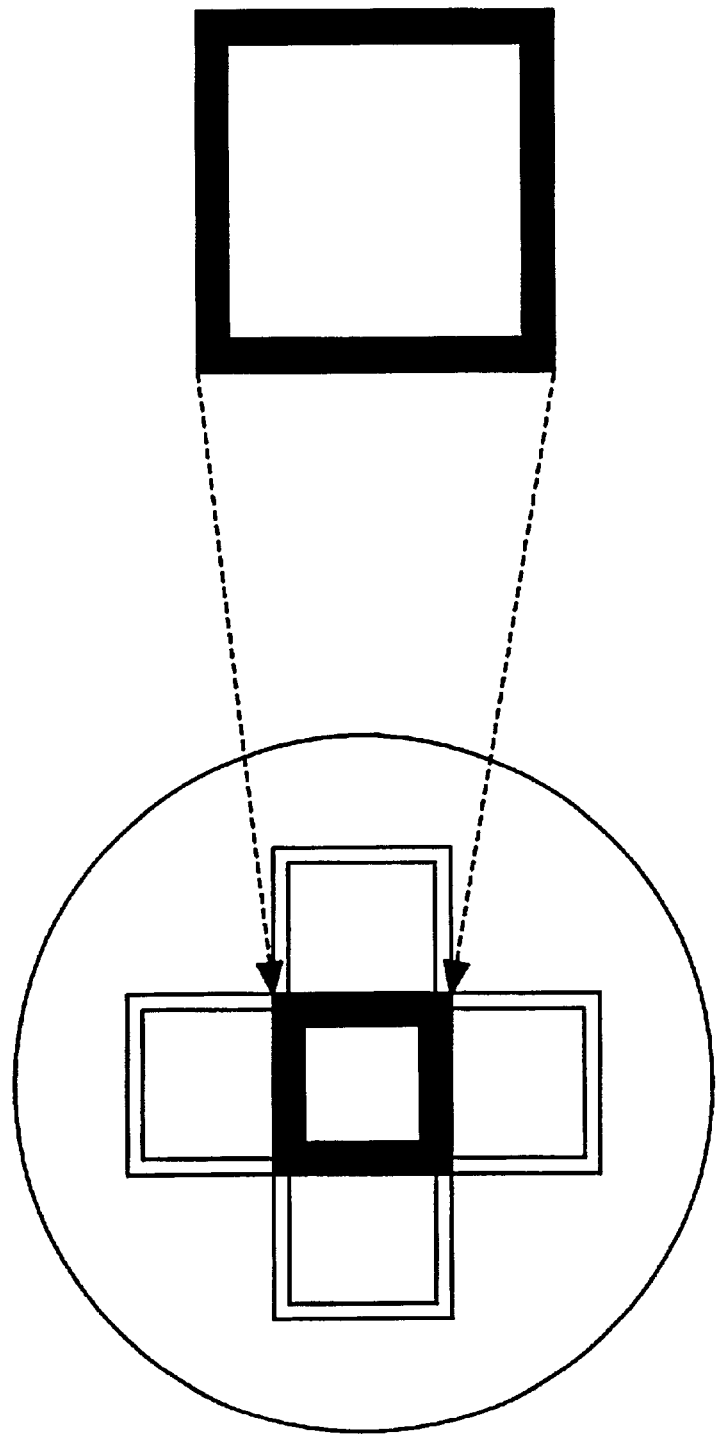
FIG. 40 is a view showing a method of dividing a reticle for electron beam projection according to an embodiment of the present invention.
Figure 41:
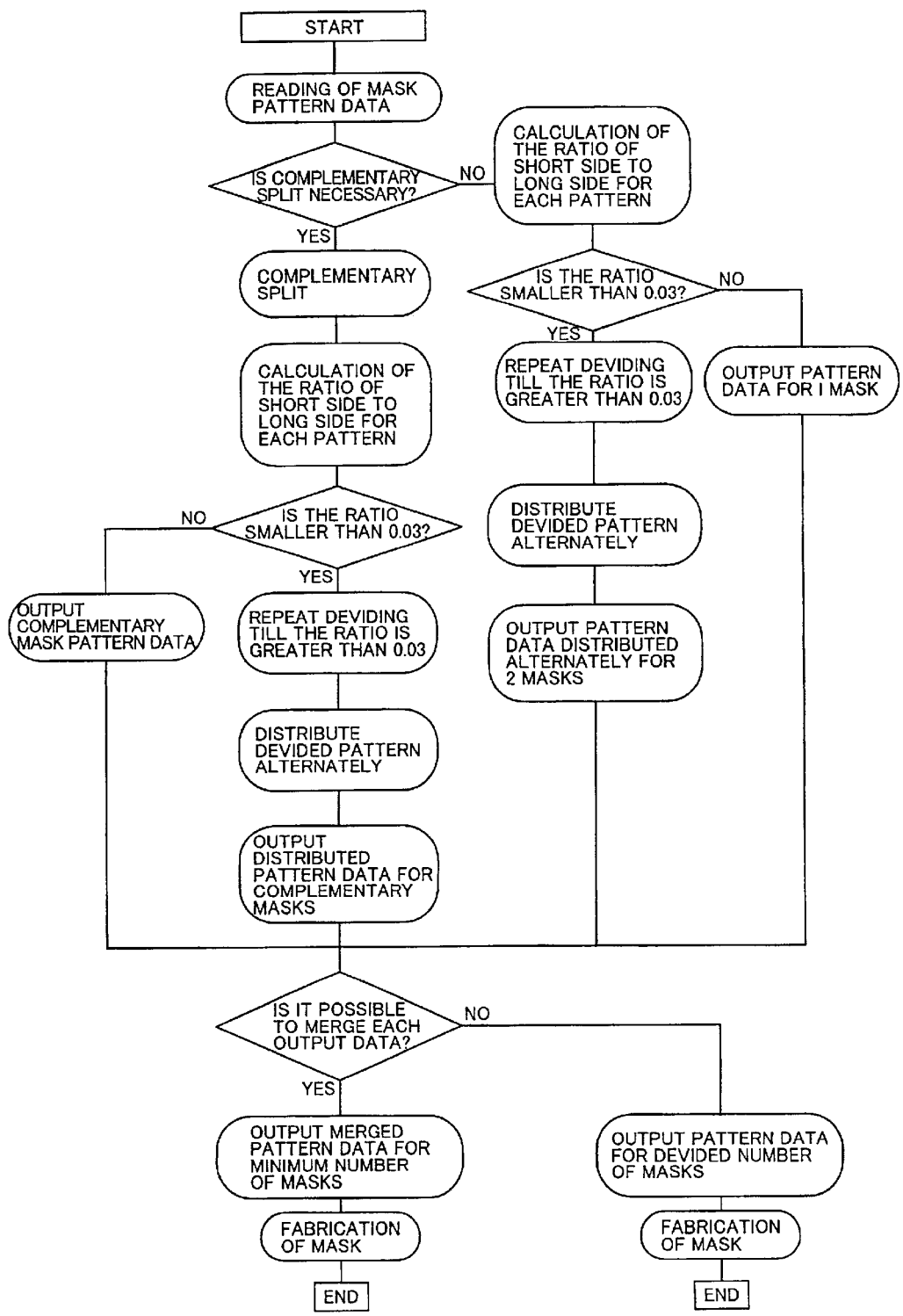
FIG. 41 is a flowchart showing division of a reticle for electron beam projection according to an embodiment of the present invention.

First, a pattern is divided into those of 0.20 mm squared smaller than a maximum value of 0.25 mm squared to be projected by one projection. In order to keep pattern positional accuracy on a dividing line and prevent micro patterns formed following division during division, the dividing line is shifted to a maximum one side 0.01 mm as shown in FIG. 40. A length of outside extension of the dividing line is set longer by 33 times than a reticle pattern size equivalent to a thickness of a reticle pattern forming portion of a stencil reticle. Based on experiment data for prevention of deformation caused by bending of the pattern portion of the stencil reticle, a ratio of a long side to a short side of the reticle pattern size equivalent to the thickness of reticle pattern forming portion is set to be larger by 33 times or more. As shown in a flowchart of FIG. 41, when an aspect ratio of a plane size is larger more than 33 times, the reticle data is divided, always cutting the pattern. By using this cut, the stencil reticle can be moved to a next portion to be exposed. Alternatively, even in the middle of the pattern, if a pattern size is equal to/higher than the thickness of the stencil reticle, execution of reticle division causes no problems of connection accuracy. In this case, a material for setting a stencil reticle to a film thickness of 200 nm is scheduled to be used. Accordingly, the expanding amount of reticle division may be set equal to/higher than 6.6 $\mu$m at one side minimum.

As a result, the chip is divided into 25 sections inside. The work of division into the 25 sections may be carried out manually, or by incorporating a process in a program, and using a computer. The present embodiment shows a method of manufacturing by dividing one chip into a plurality of stencil reticles for electron projection lithography. Needless to say, however, the method of dividing the chip into the plurality of reticles inside can be applied to a chip subdivided reticle in an ultra-violet (UV) or deep ultraviolet (DUV) exposure system or an X-ray exposure system.

Figure 43:
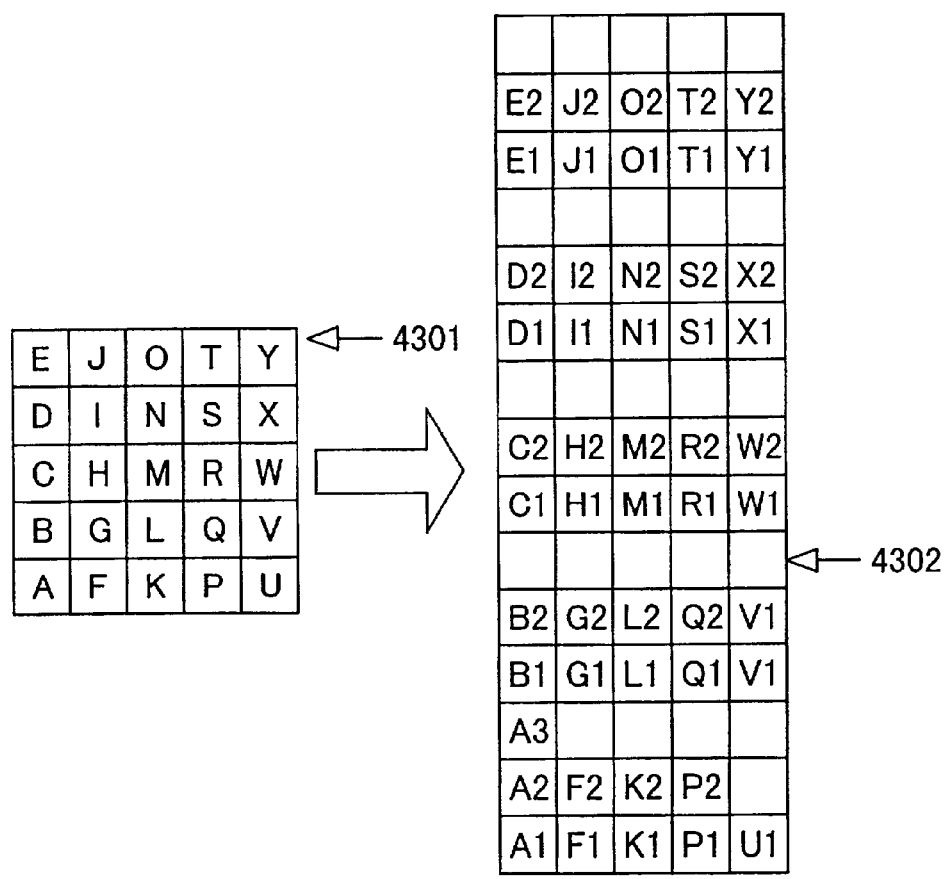
FIG. 43 is a view showing a method of arraying complementary reticles for electron beam projection according to an embodiment of the present invention.

The foregoing dividing method is programmed, incorporated in a computer, original pattern data 4301 used by the embodiment is converted as shown in FIG. 43, and disposition simulation of pattern data 4302 after complementary splitting is carried out.

For arraying of transcribed reticle patterns on an 8-inch wafer as a reticle base, the following three methods are conceivable.

As shown, complementary reticles are arrayed in a vertical direction, and all arraying pitches are set long in accordance with the maximum number of complementary reticles per one target place of projection. In this case, a subfield arraying pitch on a mask is set to 1 mm. Since the maximum number is 3, reticle sizes of one chip, arrayed at a pitch of 3.0 mm are 15 mm vertically and 5 mm horizontally. In this case, some of places which need only 1 or two reticles may have no reticles.

The complementary reticles can also be arrayed in a horizontal direction as shown in FIG. 44. Generally, the entire reticles are designed for irradiation while being moved in a vertical direction. Consequently, frequent horizontal movements during wafer writing cause problems in throughput and positional accuracy.

The complementary reticles can be arrayed without any gaps in a vertical direction as shown in FIG. 45. In this case, information regarding the complementary reticles in the chip must be registered and managed as data in an external memory or a margin of a transcribed reticle. However, an area required by the reticles of one chip is reduced, making it possible to form reticle patterns of a plurality of chips on the 8-inch wafer as the reticle base. Depending on projection positions, however, the number of times of reticle irradiation varies. Thus, a relation becomes complex between a moving speed of a sample stage and a moving speed of a reticle stage. In the embodiment, the complementary reticles are arrayed in accordance with the moving direction of the stencil reticle, and the arraying pitch is decided based on the maximum number of complementary reticles. This arrangement enables a moving speed of the stencil reticle to be constant, making it easier to match it with the moving speed of the sample stage.

The method of changing into the stencil reticle pattern from the layout view of the embodiment has been described. Next, a method of manufacturing a stencil reticle will be described by referring to FIGS. 42A to 42G.

Figure 42A:
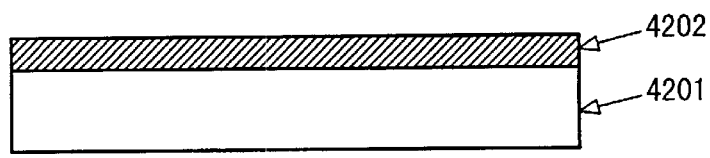
FIGS. 42A to 42G are views, each showing a method of manufacturing a complementary reticle for electron beam projection according to an embodiment of the present invention.
Figure 42B:
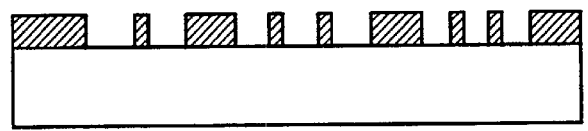
Figure 42C:
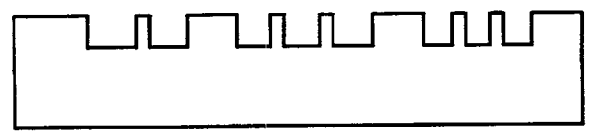
Figure 42D:
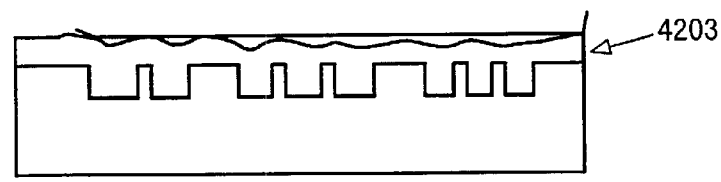
Figure 42E:
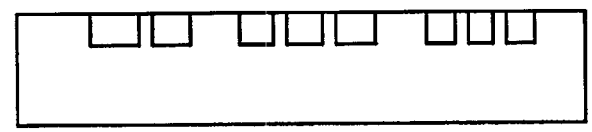
Figure 42F:
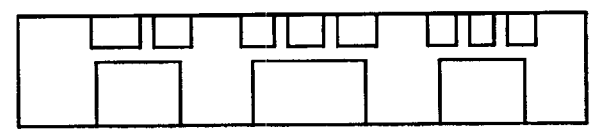
Figure 42G:
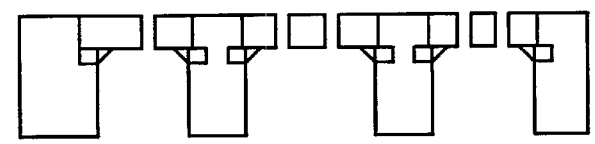

A resist 4202 is coated on a silicon substrate (thickness 725 μm, and plan direction (100)) 4201 having an 8-inch diameter (FIG. 42A), and a pattern is projected by electron beam writing (FIG. 42B). Then, silicon etching is carried out for the substrate to form a step (FIG. 42C). Then, platinum is plated on a full surface, and platinum 4203 is deposited by 200 nm (FIG. 42D). The silicon substrate surface plated with the platinum is shaved by chemical mechanical polishing (CMP) until the silicon substrate is exposed, thus executing planarization (FIG. 42E). Remaining of platinum in a trench formed by silicon etching is verified, and etching is carried out for a backside of the silicon substrate. First, a hole is drilled on a tip of a square column vibrated by a supersonic wave by a device (not shown) for supplying abrasive solution of powered diamond or the like, until a thickness 99% of the silicon substrate. For the step of drilling 99% of the thickness of the silicon substrate, areas other than a scheduled opening portion on the backside may be masked by a backside coater and a backside exposure system beforehand, and a hole may be bored by anisotropic reactive dry etching (FIG. 42F). Lastly, the remaining silicon is removed by KOH wet etching (FIG. 42G). Needless to say, a width of a strut left beforehand is equivalent to a length obtained by subtracting a length of a taper formed by the KOH etching. At the end of finish water washing of various cleanings after the wet etching, the platinum reticle is rinsed by ethanol having surface tension smaller than water and dried. The platinum reticle is attached to a reticle support holder for attaching the exposure system, and a pattern plane shape is observed by a scanning electron microscope (SEM). Since a thickness of the platinum reticle is thin, 200 nm, even a clear hole pattern of the reticle can be observed by the scanning electron microscope. In the case of the conventional reticle made of silicon, because of a thick film of 2 μm, inspection up to a deep area by the scanning electron microscope has been difficult. By manufacturing the reticle using metal of high electron beam scattering coefficient, it is possible to make thin the thickness of the reticle, thereby facilitating defect inspection of the reticle.

The advantages of the present invention can be summarized as follows.

(1) According to the invention, it is possible to properly use the photolithography and the electron projection lithography effectively. Even when the electron projection lithography is selected, by properly using the complementary and non-complementary reticles effectively, highest throughput can be obtained while satisfying required accuracy and required resolution for each product/layer. Thus, it is possible to increase productivity of the semiconductor device.

(2) According to the invention, in the case of using the electron projection lithography, by defining a size of a micro-beam for connecting an opening pattern, an interval of micro-beams, a forming place of a micro-beam, a shape of a micro-beam, and the like, a reticle having no bending can be provided. Therefore, it is possible to improve manufacturing yield of a reticle, and its durability, thereby reducing manufacturing costs of a semiconductor device.

(3) According to the invention, by an arithmetic operation carried out using the design automation function (DA), micro-beams can be automatically formed, and reticle data can be generated at a high speed. Thus, it is possible to shorten layout designing time of a reticle.

(4) According to the invention, in the reticle for electron projection lithography using micro-beams, projection of the micro-beams can be prevented by using the same place and the same subfield, and executing shift exposure. Thus, it is possible to form patterns more faithful to layout data, providing a highly reliable semiconductor device.

It should be further understood by those skilled in the art that although the foregoing description has been made on embodiments of the invention, the invention is not limited thereto and various changes and modifications may be made without departing from the spirit of the invention and the scope of the appended claims.

What is claimed is:

1. A method of manufacturing a semiconductor device by reductively projecting patterns including a plurality of non-repeated patterns formed on a mask onto a semiconductor substrate, comprising:

a first selection step of selecting photolithography for carrying out projection by irradiating the mask with a light, or charged particle projection lithography for connecting patterns present in a plurality of areas sandwiching a boundary of a limited width on the mask and two-dimensionally arrayed on a wafer; and when the charged particle projection lithography is selected, a second selection step of selecting projection of one area by carrying out mask projection once or projection of one area by superposing masks of two different types or more in a method of charged particle projection.

2. A method of manufacturing a semiconductor device including a desired pattern formed on a semiconductor substrate, comprising:

a first selection step of selecting use of a light or use of charged particles to form the desired pattern;

when the use of charged particles is selected in the first selection step, a second selection step of selecting use of a mask including a plurality of non-repeated patterns or direct writing without using the mask; and when the use of the mask is selected in the second selection step, a step of selecting projection of one area by carrying out mask projection once or projection by superposing masks of two different types or more.

3. The method of manufacturing the semiconductor device according to claim 1, wherein patterns including one selected from an isolation pattern, a gate pattern, a contact hole pattern, and a wiring pattern just after a gate level are formed by using the mask including the plurality of non-repeated patterns or the charged particles.

4. The method of manufacturing the semiconductor device according to claim 3, wherein for the patterns including the isolation pattern, the gate pattern and the contact hole pattern, projection of one area is carried out by executing mask projection once and, for the patterns including the wiring pattern just after the gate level, projection of one area is carried out by superposing masks of two different types or more.

5. The method of manufacturing the semiconductor device according to claim 1, wherein the photolithography is selected when a critical size W1 is W1≧0.5×(wavelength for exposure)/(numerical aperture of optical exposure system), and the charged particle projection lithography is selected when W1<0.5×(wavelength for exposure)/(numerical aperture of optical exposure system).

6. The method of manufacturing the semiconductor device according to claim 1, wherein the photolithography using a phase difference of light is selected when critical size W1 is W1≧0.25×(wavelength for exposure)/(numerical aperture of optical exposure system), and the charged particle projection lithography is selected when W1<0.25×(wavelength for exposure)/(numerical aperture of optical exposure system).

7. The method of manufacturing the semiconductor device according to claim 1, wherein when an area of a pattern to be projected by charged particles is equal to/lower than 0.3 of an area of a chip as a smallest peace completed by a device function obtained in a last manufacturing step of the semiconductor device, or the number of unit areas where an area of a transcribed pattern in a unit area having the chip divided into predetermined areas to be projected by charged particles all at once is equal to/lower than 0.3 of an area of the unit area is equal to/higher than 0.7 of the number of all unit areas, the step of irradiating one area by mask projection executed once is selected and, when different, the step of irradiating one area through the masks of two different types or more is selected.

8. The method of manufacturing the semiconductor device according to claim 1, wherein the mask for charged particle projection has an opening pattern and, if a size of a non-opening pattern is Wnm, and a spacing with a non-opening pattern adjacent to the non-opening pattern is Snm, then a size Lnm of the opening pattern in a longitudinal direction is set to 0<L≦(S+W−50)×50.

9. The method of manufacturing the semiconductor device according to claim 1, wherein if a spacing between a size Wnm of a non-opening pattern and a non-opening pattern adjacent to the non-opening pattern is Snm, then a length Lnm of a pattern divided by a micro-beam is set to 0<L≦(S+W−50)×10.

10. The method of manufacturing the semiconductor device according to claim 8, wherein the micro-beam is provided for each predetermined spacing.

11. The method of manufacturing the semiconductor device according to claim 8, wherein the micro-beam is provided at an intersection portion of T-shaped opening patterns.

12. The method of manufacturing the semiconductor device according to claim 8, wherein the micro-beam has a ladder shape formed by alternately arraying horizontal lines connecting vertical lines parallel to each other, or by alternately arraying vertical lines connecting horizontal lines parallel to each other on an opening pattern having a short side set equal to/higher than a predetermined width.

13. The method of manufacturing the semiconductor device according to claim 8, wherein a material of the micro-beam has a low scattering coefficient of charged particles compared with a main constituting material of the mask.

14. The method of manufacturing the semiconductor device according to claim 8, wherein in the unit areas to be projected by charged particles all at once, the mask has a plurality of unit areas having different mask opening area, and a width of a micro-beam of the unit area having a small mask opening area is set equal to/lower than a width of a micro-beam of the unit area having a large mask opening area.

15. The method of manufacturing the semiconductor device according to claim 8, wherein in the unit areas to be projected by the charged particles all at once, a width of an opening pattern having a small width is set equal to/lower than a width of a micro-beam of an opening pattern having a large width.

16. The method of manufacturing the semiconductor device according to claim 8, wherein a width of the micro-pattern is set equal to/lower than ¼ of an opening pattern size, and ≧40 nm to ≦400 nm of a mask size.

17. The method of manufacturing the semiconductor device according to claim 8, wherein a distance between the micro-beam and a side of an opening pattern opposite the micro-beam is larger by ten times or more than a width of the micro-beam.

18. The method of manufacturing the semiconductor device according to claim 8, wherein in the micro-beam, a width of an opening area in a portion having the micro-beam is larger than a width of an opening area in a portion having no micro-beams.

19. The method of manufacturing the semiconductor device according to claim 18, wherein a width of the micro-beam is equal to/lower than 200 nm on the mask, and a length of the micro-beam is equal to/lower than 200 nm.

20. The method of manufacturing the semiconductor device according to claim 8, wherein the micro-beam is asymmetrical to a center line of the opening pattern.

21. The method of manufacturing the semiconductor device according to claim 8, wherein the micro-beam is disposed obliquely to a longitudinal direction of the opening area.

22. The method of manufacturing the semiconductor device according to claim 21, wherein the micro-beam is disposed to be 45° or −45° to the longitudinal direction.

23. The method of manufacturing the semiconductor device according to claim 8, wherein in the mask having the micro-beam for charged particle projection lithography, a micro-beam formation limiting area is provided, and a shape of a micro-beam in the micro-beam formation limiting area is different from a shape of a micro-beam in other than the micro-beam formation limiting area.

24. The method of manufacturing the semiconductor device according to claim 23, wherein the micro-beam formation limiting area is present on an active area of a gate level.

25. A method of manufacturing a semiconductor device by reductively projecting patterns including a plurality of non-repeated patterns formed on a mask onto a semiconductor substrate, comprising:

a step of carrying out a first round of projection by using the mask having a micro-beam having a non-opening area connected, and an opening pattern width shortened by a predetermined amount in a direction orthogonal to the micro-beam; and a step of carrying out a second round of projection by using the mask, and shifting a projection position in a direction orthogonal to an arraying direction of the micro-beam.

26. The method of manufacturing the semiconductor device according to claim 25, wherein double exposure shifts the projection position in a direction horizontal to the semiconductor substrate by changing a current of a deflection lens for controlling a projection position of charged particle projection lithography means.

27. The method of manufacturing the semiconductor device according to claim 25, wherein as a method of projection by shifting the projection position in the direction horizontal to the semiconductor substrate, a relative relation between an area to be projected by charged particle projection carried out once, and the semiconductor substrate is undulated.

28. The method of manufacturing the semiconductor device according to claim 26, wherein the shifting exposure shits the projection position by providing a deflection lens designed for projection position shifting.

29. The method of manufacturing the semiconductor device according to claim 28, wherein the lens for projection position shifting has at least two kinds of predetermined values for currents of the deflection lens for defecting the projection position, and the projection position is shifted by switching parameters.

30. The method of manufacturing the semiconductor device according to claim 29, wherein the projection position shifting exposure shifts the projection position by rotation having a predetermined radius around a predetermined projection position.

* * * * *